(12) United States Patent
Kapit

(10) Patent No.: US 11,106,980 B2
(45) Date of Patent: Aug. 31, 2021

(54) QUANTUM ANNEALING WITH OSCILLATING FIELDS

(71) Applicant: THE ADMINISTRATORS OF THE TULANE EDUCATIONAL FUND, New Orleans, LA (US)

(72) Inventor: Eliot Kapit, Golden, CO (US)

(73) Assignee: THE ADMINISTRATORS OF THE TULANE EDUCATIONAL FUND, New Orleans, LA (US)

( * ) Notice: Subject to any disclaimer, the term of this patent is extended or adjusted under 35 U.S.C. 154(b) by 0 days.

(21) Appl. No.: 16/759,595

(22) PCT Filed: Oct. 25, 2018

(86) PCT No.: PCT/US2018/057543
§ 371 (c)(1),
(2) Date: Apr. 27, 2020

(87) PCT Pub. No.: WO2019/084286
PCT Pub. Date: May 2, 2019

(65) Prior Publication Data
US 2020/0272910 A1    Aug. 27, 2020

Related U.S. Application Data

(60) Provisional application No. 62/576,959, filed on Oct. 25, 2017.

(51) Int. Cl.
*G06N 5/00* (2006.01)
*G06N 10/00* (2019.01)
(52) U.S. Cl.
CPC ............. *G06N 5/003* (2013.01); *G06N 10/00* (2019.01)

(58) Field of Classification Search
None
See application file for complete search history.

(56) References Cited

U.S. PATENT DOCUMENTS 7,498,832 B2    3/2009  Baumgardner et al.
7,788,192 B2    8/2010  Amin
(Continued)

OTHER PUBLICATIONS

Hen, Itay, and Federico M. Spedalieri. "Quantum annealing for constrained optimization." Physical Review Applied 5.3 (2016): 034007. (Year: 2016).*

(Continued)

*Primary Examiner* — Daniel T Pellett
(74) *Attorney, Agent, or Firm* — Lathrop GPM LLP

(57) ABSTRACT

Embodiments herein implement quantum annealing with a driver Hamiltonian that uses oscillating fields to advantageously obtain a quantum speedup over classical computing techniques. For a many-body quantum system formed with qubits, the oscillating fields drive the qubits so as to independently modulate the magnitudes and/or directions of transverse terms of the driver Hamiltonian. In particular, embodiments provide a quantum speedup for two types of first-order phase transitions: the paramagnet-to-spin-glass transition, and transitions between distinct "bit string" states. The resulting speedup is robust against energy fluctuations (e.g., 1/f noise), in contrast to other strategies like variable-rate annealing. Each oscillating field may be an oscillating electric field or magnetic field. The oscillating fields can be implemented with superconducting flux qubits by coupling oscillating fluxes and/or voltages to the flux qubits.

27 Claims, 18 Drawing Sheets

(56) References Cited

U.S. PATENT DOCUMENTS

| | | | |
|---|---|---|---|
| 8,229,863 B2 | 7/2012 | Amin et al. | |
| 10,467,544 B2* | 11/2019 | Filipp | G06F 15/82 |
| 2016/0300155 A1* | 10/2016 | Betz | H01L 39/025 |
| 2016/0335558 A1* | 11/2016 | Bunyk | G06F 15/82 |
| 2017/0364362 A1* | 12/2017 | Lidar | G06F 9/3016 |

OTHER PUBLICATIONS

Paladino, E., et al. "1/f noise: Implications for solid-state quantum information." Reviews of Modern Physics 86.2 (2014): 361. (Year: 2014).*

Kapit, Eliot. "Imporved quantum annealer performance from oscillating transverse fields." (2017). (Year: 2017).*

Hen, Itay, and Marcelo S. Sarandy. "Driver Hamiltonians for constrained optimization in quantum annealing." Physical Review A 93.6 (2016): 062312. (Year: 2016).*

Santoro, Giuseppe E., and Erio Tosatti. "Optimization using quantum mechanics: quantum annealing through adiabatic evolution." Journal of Physics A: Mathematical and General 39.36 (2006): R393. (Year: 2006).*

Vinci, Walter, et al. "Quantum annealing correction with minor embedding." Physical Review A 92.4 (2015): 042310. (Year: 2015).*

Kadowaki, Tadashi, and Hidetoshi Nishimori. "Quantum annealing in the transverse Ising model." Physical Review E 58.5 (1998): 5355. (Year: 1998).*

Suzuki, Sei, Hidetoshi Nishimori, and Masuo Suzuki. "Quantum annealing of the random-field Ising model by transverse ferromagnetic interactions." Physical Review E 75.5 (2007): 051112. (Year: 2007).*

Bravyi, Sergey, et al. "The complexity of stoquastic local Hamiltonian problems." arXiv preprint quant-ph/0606140 (2006). (Year: 2006).*

Zimmer, Michael F. "Ising model in an oscillating magnetic field: Mean-field theory." Physical Review E 47.6 (1993): 3950. (Year: 1993).*

Huang, Kerson. Statistical Mechanics. Wiley, 1987, pp. 341-344. (Year: 1987).*

International Patent Application No. PCT/US2018/057543; International Search Report and Written Opinion dated Jan. 4, 2019; 7 pages.

Kadowaki et al. (1998), "Quantum annealing in the transverse Ising model," Physical Review E 58.5 (1998): 5355.

\* cited by examiner

QUANTUM ANNEALING WITH OSCILLATING FIELDS

CROSS-REFERENCE TO RELATED APPLICATION

This application is a 35 U.S.C. § 371 filing of International Application No. PCT/US2018/057543, filed Oct. 25, 2018, which claims priority to U.S. Provisional Patent Application Ser. No. 62/576,959, filed Oct. 25, 2017, which is incorporated herein by reference.

STATEMENT REGARDING FEDERALLY SPONSORED RESEARCH OR DEVELOPMENT

This invention was made with U.S. government support under Grant Number PHY-1653820, awarded by the National Science Foundation, and Grant Number LEQSF (2016-19)-RD-A-19, awarded by the Louisiana Board of Regents. The government has certain rights in this invention.

FIELD

Embodiments relate to quantum computing, and in particular, quantum annealing.

BACKGROUND

Quantum annealing is an analog quantum computing scheme that solves an optimization problem by adiabatically transferring a many-body quantum system (MBQS) from a ground state of an initial driver Hamiltonian to a ground state of a final problem Hamiltonian. The problem Hamiltonian encodes the optimization problem such that the ground state of the problem Hamiltonian corresponds to the solution of the optimization problem. Quantum annealing utilizes the adiabatic theorem of quantum mechanics to maximize the probability that the MBQS is adiabatically transferred into the ground state of the problem Hamiltonian. After annealing, a final state of the MBQS may be measured to determine if the MBQS was transferred into the ground state, or a different higher-energy state, of the problem Hamiltonian.

SUMMARY OF THE EMBODIMENTS

Embodiments herein implement quantum annealing with a novel driver Hamiltonian $H_{D/M}(t)$ that uses oscillating fields to advantageously speed up quantum annealing. The MBQS is formed from a plurality of qubits, and the oscillating fields drive the qubits so as to independently modulate the magnitudes and/or transverse directions of terms of the driver Hamiltonian. Each oscillating field may be an oscillating electric field or an oscillating magnetic field. For clarity, it is assumed that a quantization axis is aligned along a longitudinal z direction such that the transverse directions are the x and y directions.

Quantum annealing may solve NP-hard optimization problems faster than a classical computing system, an advantage referred to herein as a "quantum speedup." Combinatorial optimization is one area of applied mathematics and computer science in which NP-hard optimization problems are encountered. Several NP-hard combinatorial optimization problems can each be recast as a quadratic unconstrained binary optimization problem that may be solved faster with quantum annealing compared to classical computing. Examples of such problems include the traveling salesman problem, the Boolean satisfiability problem (e.g., 3-SAT), the Max-Cut problem, the clique problem, set packing, graph coloring, and the quadratic assignment problem.

Embodiments herein provide a quantum speedup for two types of first-order quantum phase transitions, advantageously allowing the true ground state of the problem Hamiltonian to be found more quickly compared to prior-art quantum annealing implementations. The first type of transition is the paramagnet-to-spin-glass transition, of which Grover's algorithm is an example. The second type of transition is between distinct "bit string" states (i.e., configurations where each spin has a fixed z eigenvalue, up to small corrections from the transverse field) that model tunneling between local minima in a spin glass for large-N problems (where N quantifies a problem size). Thus, embodiments herein may provide a quantum speedup for a wide range of hard combinatorial optimization problems.

Current quantum annealing platforms implement a stoquastic problem Hamiltonian in which all off-diagonal terms of the problem Hamiltonian in the computational basis are real and negative. Quantum annealing with a stoquastic problem Hamiltonian is referred to herein as "StoqAQC." Many StoqAQC problems may be efficiently simulated on a classical computing system using quantum Monte Carlo techniques, and thus StoqAQC may never demonstrate a quantum speedup. Thus, non-stoquastic terms in the problem Hamiltonian may demonstrate a quantum speedup.

For some highly symmetric "unstructured" problems, such as Grover's search algorithm, StoqAQC may achieve a square-root quantum speedup by adiabatically annealing at a variable annealing rate proportional to an instantaneous energy gap of the MBQS. Near the phase transition, where the instantaneous gap is a minimum, annealing may proceed relatively slowly. However, experimentally verifying this prediction has been stymied by two challenges. First, a location and/or size of the minimum gap may not be known a priori, and measuring it to the required exponential precision near a first-order phase transition is generally as difficult as solving the problem itself. Second, in any physical implementation, local energy fluctuations (e.g., 1/f noise) "blur" the quantum trajectories, erasing variable-rate annealing's advantage.

In embodiments, driver Hamiltonian $H_{D/M}(t)$ presented herein advantageously provides a quantum speedup for Grover's algorithm by adiabatically annealing at a constant annealing rate, thereby overcoming the challenges of implementing StoqAQC with a variable annealing rate. As described in more detail below, the predicted scaling of $2^{0.747N}$ is worse than the provable optimum of $2^{N/2}$, yet better than the $2^N$ scaling for classical computing and StopAQC with a constant annealing rate. Thus, the quantum speedup provided by these embodiments cannot be duplicated in classical simulation.

In a first aspect, a quantum annealing method includes decoupling qubits from oscillating fields that drive the qubits according to a driver Hamiltonian and coupling the qubits to each other according to a problem Hamiltonian, wherein the oscillating fields drive a plurality of transitions such that decoupling and coupling transfer the qubits from an initial state of the driver Hamiltonian to a final state of the problem Hamiltonian.

In certain embodiments of the first aspect, the method further includes driving the qubits with the oscillating fields according to the driver Hamiltonian so that each of the oscillating fields drives one of the qubits.

In certain embodiments of the first aspect, the method further includes setting an identical amplitude to the oscillating fields, and assigning a randomly-chosen frequency and a randomly-chosen sign of the identical amplitude to each of the oscillating fields.

In certain embodiments of the first aspect, assigning the randomly-chosen frequency includes assigning a distinct randomly-chosen frequency to each of the oscillating fields.

In certain embodiments of the first aspect, the method further includes randomly selecting the distinct randomly-chosen frequency from a frequency range chosen according to a problem class of the problem Hamiltonian.

In certain embodiments of the first aspect, the method further includes assigning each of the oscillating fields to one of a plurality of groups, and setting an identical frequency and an identical phase to the oscillating fields of each of the groups.

In certain embodiments of the first aspect, driving the qubits includes driving the qubits transversely to a quantization axis.

In certain embodiments of the first aspect, driving the qubits transversely to the quantization axis includes driving the qubits with the oscillating fields rotating in a plane transverse to the quantization axis.

In certain embodiments of the first aspect, the method further includes modulating each of the oscillating fields so as to couple a plurality of harmonics to each of the qubits.

In certain embodiments of the first aspect, each of the qubits is a flux qubit having a loop of superconducting wire interrupted by a superconducting quantum interference device (SQUID), and driving the qubits transversely to the quantization axis includes threading an oscillating magnetic flux of each of the oscillating fields through the SQUID of a corresponding flux qubit.

In certain embodiments of the first aspect, each of the qubits is a flux qubit having a loop of superconducting wire interrupted by a superconducting quantum interference device (SQUID), and driving the qubits transversely to the quantization axis includes coupling an oscillating voltage across the SQUID of a corresponding flux qubit.

In certain embodiments of the first aspect, decoupling the qubits includes decoupling the qubits according to an annealing schedule, and coupling the qubits includes coupling the qubits to each other according to the annealing schedule.

In certain embodiments of the first aspect, the method further includes preparing the qubits, prior to decoupling and coupling, in the initial state of the driver Hamiltonian.

In certain embodiments of the first aspect, the initial state of the driver Hamiltonian is a ground state of the driver Hamiltonian.

In certain embodiments of the first aspect, the final state of the problem Hamiltonian is a ground state of the problem Hamiltonian.

In certain embodiments of the first aspect, preparing the qubits includes ramping up amplitudes of the oscillating fields at a beginning of the annealing schedule.

In certain embodiments of the first aspect, preparing the qubits includes ramping up amplitudes of the oscillating fields prior to a beginning of the annealing schedule.

In certain embodiments of the first aspect, coupling the qubits includes adjusting a plurality of interqubit couplings that couple the qubits to each other according to the problem Hamiltonian, and the method further includes modulating a plurality of transverse interqubit couplings, of the interqubit couplings, that transversely couple the qubits to each other.

In certain embodiments of the first aspect, modulating the transverse interqubit couplings includes modulating each of the transverse interqubit couplings.

In certain embodiments of the first aspect, decoupling the qubits includes decoupling the qubits according to an annealing schedule and adjusting the interqubit couplings includes adjusting the interqubit couplings according to the annealing schedule, and the method further includes changing the modulating of the transverse interqubit couplings according to a second annealing schedule different from the annealing schedule.

In certain embodiments of the first aspect, changing the modulating includes starting the modulating after a beginning of the annealing schedule and stopping the modulating before an end of the annealing schedule.

In a second aspect, a quantum annealing method includes decoupling qubits from oscillating fields that drive the qubits according to a driver Hamiltonian, adjusting a plurality of longitudinal interqubit couplings that longitudinally couple the qubits to each other according to a problem Hamiltonian, and modulating a plurality of transverse interqubit couplings that transversely couple the qubits to each other.

In certain embodiments of the second aspect, decoupling the qubits includes decoupling the qubits according to an annealing schedule, and adjusting the longitudinal interqubit couplings includes adjusting the longitudinal interqubit couplings according to the annealing schedule.

In certain embodiments of the second aspect, the method further includes changing the modulating of the transverse interqubit couplings according to a second annealing schedule different from the annealing schedule.

In certain embodiments of the second aspect, changing the modulating includes starting the modulating after a beginning of the annealing schedule and stopping the modulating before an end of the annealing schedule.

In certain embodiments of the second aspect, the method further includes driving the qubits with the oscillating fields according to the driver Hamiltonian.

In a third aspect, a quantum annealing method includes: preparing qubits in an initial state of a problem Hamiltonian; coupling the qubits, after preparing, to oscillating fields that drive the qubits according to a driver Hamiltonian; and decoupling the qubits, after coupling, from the oscillating fields.

DETAILED DESCRIPTION OF THE EMBODIMENTS

Figure 1:
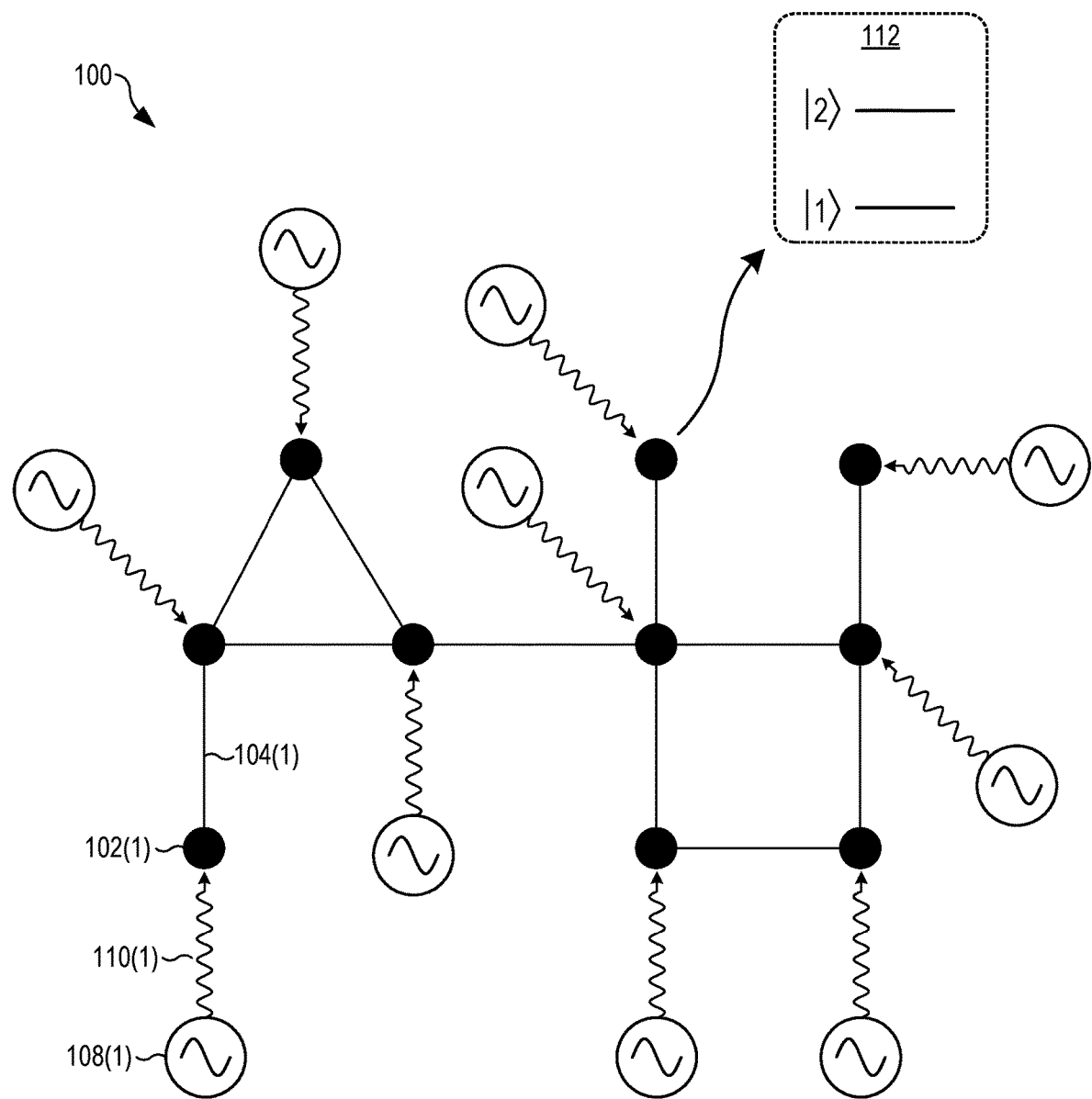
FIG. 1 is a functional diagram of an example many-body quantum system (MBQS) with which embodiments described herein may be implemented, in embodiments.

FIG. 1 is a functional diagram of an example many-body quantum system (MBQS) 100 with which embodiments described herein may be implemented. MBQS 100 is formed from a plurality of qubits 102 coupled to each other with a plurality of interqubit couplings 104. MBQS 100 is shown in FIG. 1 as a graph having a plurality of vertices interconnected with a plurality of edges, wherein each of the vertices represents one of qubits 102 and each of the edges represents one of interqubit couplings 104. Each of qubits 102 is a two-level quantum mechanical system 112, or an approximation thereof.

FIG. 1 also shows a plurality of oscillators 108 driving qubits 102 with oscillating fields 110 according to driver Hamiltonian $\hat{H}_{D/M}(t)$. In one embodiment, each of oscillating fields 110 drives one of qubits 102 such that a number $N_F$ of oscillating fields 110 and a number $N_q$ of qubits 102 are equal. In another embodiment, each of oscillating fields 110 has a distinct frequency. While FIG. 1 shows each of qubits 102 being directly driven by one of oscillating fields 110, it should be appreciated that with interqubit couplings 104, each of qubits 102 may be driven by several of oscillating fields 110 via interqubit couplings 104. For clarity, each of oscillating fields 110 with a distinct frequency may be referred to herein as a "tone."

While FIG. 1 shows MBQS 100 having ten qubits 102 and ten interqubit couplings 104, MBQS 100 may have any number of qubits 102 and/or any number of interqubit couplings 104, as needed to implement the problem Hamiltonian, without departing from the scope hereof. For example, MBQS 100 may have thousands of qubits 102 and thousands of interqubit couplings 104. While FIG. 1 shows MBQS 100 having qubits coupled to one, two, three, and four other qubits 102, each of qubits 102 may be coupled to any number of other qubits 102, up to a total number of $N_q-1$ other qubits 102, without departing from the scope hereof.

Driver Hamiltonian $\hat{H}_{D/M}(t)$ is represented herein in two forms: $\hat{H}_D(t)$ and $\hat{H}_M(t)$. The first form, $\hat{H}_D(t)$, represents oscillating fields 110 driving qubits 102 with a direction modulated in the transverse x-y plane. Mathematically, $$\hat{H}_D(t) = -\kappa \sum_{i=1}^{N_F} \cos[\alpha_i \sin(2\pi f_i t)]\sigma_x^{(i)} + \sin[\alpha_i \sin(2\pi f_i t)]\sigma_y^{(i)}, \quad (1)$$

where $\kappa$ is a driver coupling strength, each $\alpha_i$ is an amplitude of one of oscillating fields 110, and each $f_i$ is a frequency (in hertz) of said one of oscillating fields 110. Thus, each term in the summation of Eqn. 1 corresponds to one of oscillating fields 110 driving one of qubits 102. The second form, $\hat{H}_M(t)$, represents oscillating fields 110 driving qubits 102 along the transverse x direction with a modulated magnitude. Mathematically, $$\hat{H}_M = -\kappa \sum_{i=1}^{N_F} [1 + \alpha_i \sin(2\pi f_i t)]\sigma_x^{(i)}. \quad (2)$$

The second form, $\hat{H}_M(t)$, may alternatively have oscillating fields 110 driving qubits 102 along the transverse y direction instead of the x direction (i.e., replace each $\sigma_x^{(i)}$ in Eqn. 2 with $\sigma_y^{(i)}$). In some embodiments, each amplitude $\alpha_i$ is equal to an identical magnitude $\alpha$ and a randomly-selected sign $+$ or $-$.

The problem Hamiltonian $\hat{H}_P$ may be expressed most generally by representing qubits 102 as spins in a static external field q that longitudinally couples to qubits 102:

$$\hat{H}_P = \sum_{i=1}^{N_q} \frac{q}{2}\sigma_z^{(i)} + \sum_{i<j}^{N_q} \sum_{x_1,x_2=1}^{3} J_{x_1,x_2}^{(i,j)} \sigma_{x_1}^{(i)} \otimes \sigma_{x_2}^{(j)}, \quad (3)$$

where $\sigma_m^{(i)}$ is the Pauli matrix for qubit i along a Cartesian direction m (i.e., m is one of x, y, and z) and $\Omega_i$ is a transverse intraqubit coupling strength that mixes the two $\sigma_z^{(i)}$ eigenstates (i.e., a spin-up state and a spin-down state) of qubit i. The double sum in Eqn. 3 represents interqubit couplings 104 of FIG. 1, with the outer sum running uniquely over qubit pairs (i,j) and the inner sum running over all three Cartesian directions (x,y,z) for each qubit of each pair. The term $J_{x_1,x_2}^{(i,j)}$ is an interqubit coupling strength between qubits i and j, wherein qubit i is coupled along the $x_1$ direction and qubit j is coupled along the $x_2$ direction.

For clarity in the following discussion, each of the terms in Eqn. 3 with $J_{z,z}^{(i,j)}$ may be described as a "longitudinal interqubit coupling" for which both qubits of each qubit pair are coupled longitudinally (i.e., along the z direction). By contrast, each of the terms with $J_{x,x}^{(i,j)}$, $J_{y,y}^{(i,j)}$, $J_{x,y}^{(i,j)}$, and $J_{y,x}^{(i,j)}$ may be described as a "fully transverse interqubit coupling" for which both qubits of each qubit pair are coupled transversely. Each of the terms with $J_{x,z}^{(i,j)}$, $J_{z,x}^{(i,j)}$, $J_{y,z}^{(i,j)}$, and $J_{z,y}^{(i,j)}$ may be described as a "partially transverse interqubit coupling" for which each qubit pair has one qubit driven longitudinally and one qubit driven transversely. Any interqubit coupling term having at least one transverse direction may be described as a "transverse interqubit coupling."

In some embodiments, qubits 102 are physically implemented with only longitudinal interqubit couplings. In this case, Eqn. 3 simplifies to $$\hat{H}_P = \sum_{i=1}^{N_q} \frac{q}{2}\sigma_z^{(i)} + \sum_{i<j}^{N_q} J_{z,z}^{(i,j)}\sigma_z^{(i)} \otimes \sigma_z^{(j)}, \qquad (4)$$

which admits a spin-glass phase.

An instantaneous Hamiltonian $\hat{H}_I$ is given by $$\hat{H}_I(s(t)) = (1-s(t))\hat{H}_{D/M}(t) + s(t)\hat{H}_P, \qquad (5)$$

where $\hat{H}_{D/M}(t)$ may be either $\hat{H}_D(t)$ or $\hat{H}_M(t)$, and s(t) is an annealing schedule dictating how $\hat{H}_I(s(t))$ is evolved over time. For clarity, it is assumed that s(t) is a linear ramp $s(t)=t/t_f$ that starts at an initial time $t_0=0$ (i.e., s(0)=0) and ends at a final time $t=t_f$ (i.e., $s(t_f)=1$). However, other forms of annealing schedule s(t) may be used without departing from the scope hereof. For example, some benefit may be gained by annealing more slowly (i.e., reducing a slope of s(t)) in the vicinity of a phase transition, if a location of the phase transition is known.

In embodiments, quantum annealing of MBQS 100 may be implemented with driver Hamiltonian $\hat{H}_{D/M}(t)$ by first preparing qubits 102 in the ground state of $\hat{H}_{D/M}(t)$. That is, the annealing begins at t=0 such that $\hat{H}_I(s(t=0))=\hat{H}_I(0)=\hat{H}_{D/M}(0)$. In embodiments, the annealing also begins with all amplitudes $\alpha_i$ set to zero, resulting in an initial Hamiltonian $$\hat{H}_I(0) = -\kappa \sum_{i=1}^{N_q} \sigma_x^{(i)}, \qquad (6)$$

having a disordered paramagnetic ground state. Starting at t=0, amplitudes $\alpha_i$ may then ramped up to an identical magnitude α in a time long enough to ensure that harmonics from the ramping do not heat MBQS 100 by driving qubits 102 to higher energy levels, and fast enough that the amplitudes $\alpha_i$ have reached the identical magnitude α before MBQS 100 crosses a phase transition (e.g., see critical point $s_c$ in FIG. 2 below).

Quantum annealing of MBQS 100 then proceeds by changing experimental parameters so as to evolve instantaneous Hamiltonian $\hat{H}_I(t)$ according to annealing schedule s(t). After annealing (i.e., after the final time $t_f$), qubits 102 may be read to measure the final state and determine if the final state is the ground state or a higher-energy state of $\hat{H}_P$.

Figure 2:
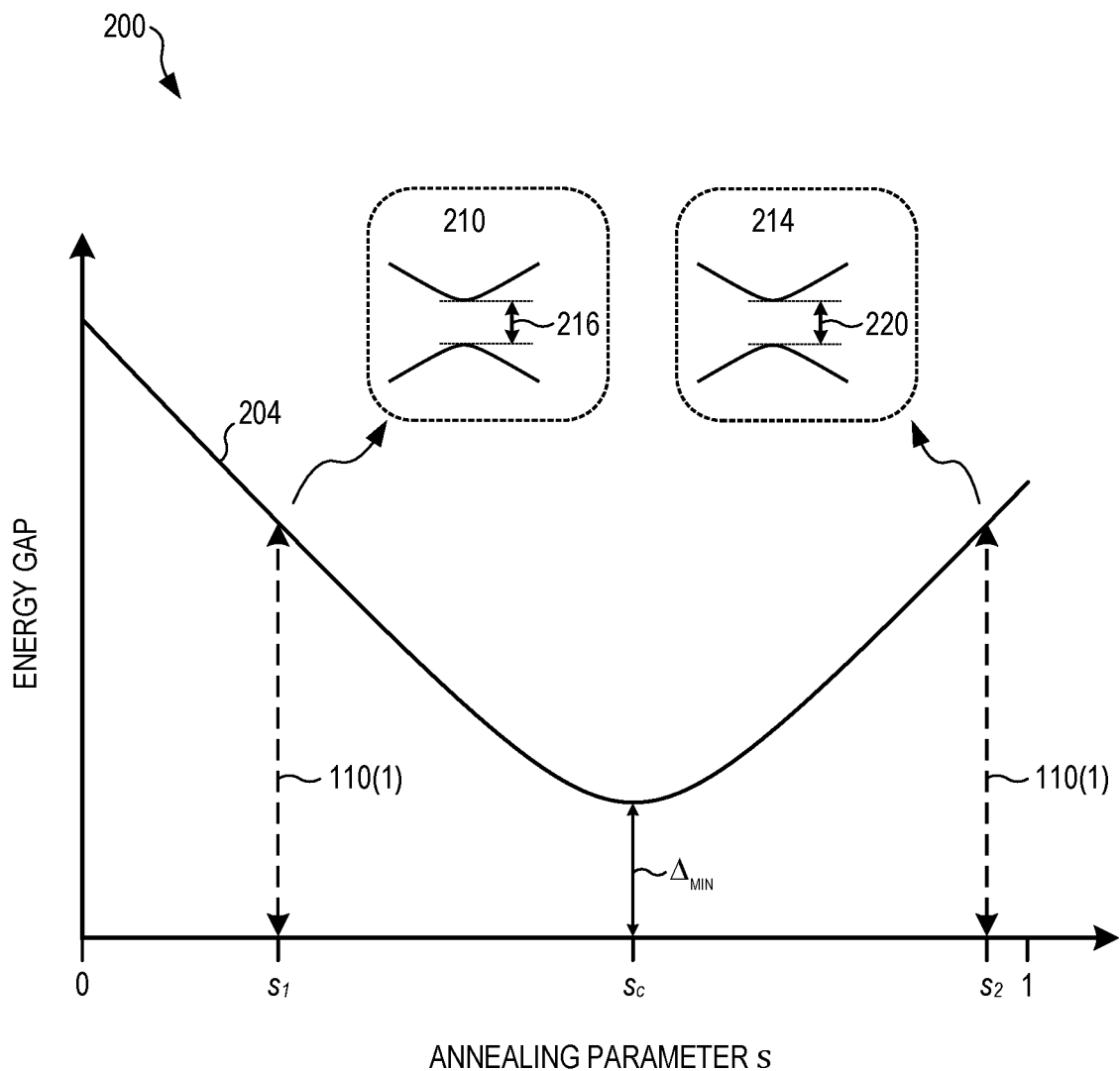
FIG. 2 is a plot of an energy gap versus an annealing parameter for an instantaneous Hamiltonian, in embodiments.

FIG. 2 is a plot 200 of an energy gap 204 versus an annealing parameter s for instantaneous Hamiltonian $\hat{H}_I(t)$. Energy gap 204 equals a difference in eigenenergies of the two lowest-energy states of $\hat{H}_I(t)$, specifically the ground state and a lowest-energy excited state. Energy gap 204 reaches a minimum energy gap $\Delta_{min}$ at a critical point $s_c$ corresponding to a quantum phase transition. For example, when annealing begins with the Hamiltonian in Eqn. 6 and ends with the problem Hamiltonian of Eqn. 4, the quantum phase transition is a paramagnet-to-spin-glass transition. The phase transition at $s_c$ forms an avoided crossing through which MBQS 100 may be swept adiabatically such that the final state (i.e., at the final time $t_f$) is the ground state of problem Hamiltonian $\hat{H}_P$. Hamiltonian $\hat{H}_I(t)$ has additional excited states and corresponding eigenenergies, that are not shown in FIG. 2 for clarity.

Plot 200 also shows one oscillating field 110(1) resonantly driving MBQS 100 at two values of annealing parameter s. At a first annealing parameter value $s_1$, energy gap 204 equals a frequency of oscillating field 110(1), at which point oscillating field 110(1) couples the ground and excited states to form a first avoided crossing 210 with a first minimum gap 216 equal to $2\Omega_1$, where $\Omega_1$ is a coupling strength (i.e., a Rabi frequency) proportional to the amplitude $\alpha_1$ of oscillating field 110(1). At a second annealing parameter value $s_2$, energy gap 204 again equals the frequency of oscillating field 110(1), wherein oscillating field 110(1) again couples the ground and excited states to form a second avoided crossing 214 having a second minimum gap 220. MBQS 100 may be adiabatically swept through first and second avoided crossings 210, 214 to maximize a probability that MBQS 100 remains in the ground state of $\hat{H}_I(t)$.

Figure 3:
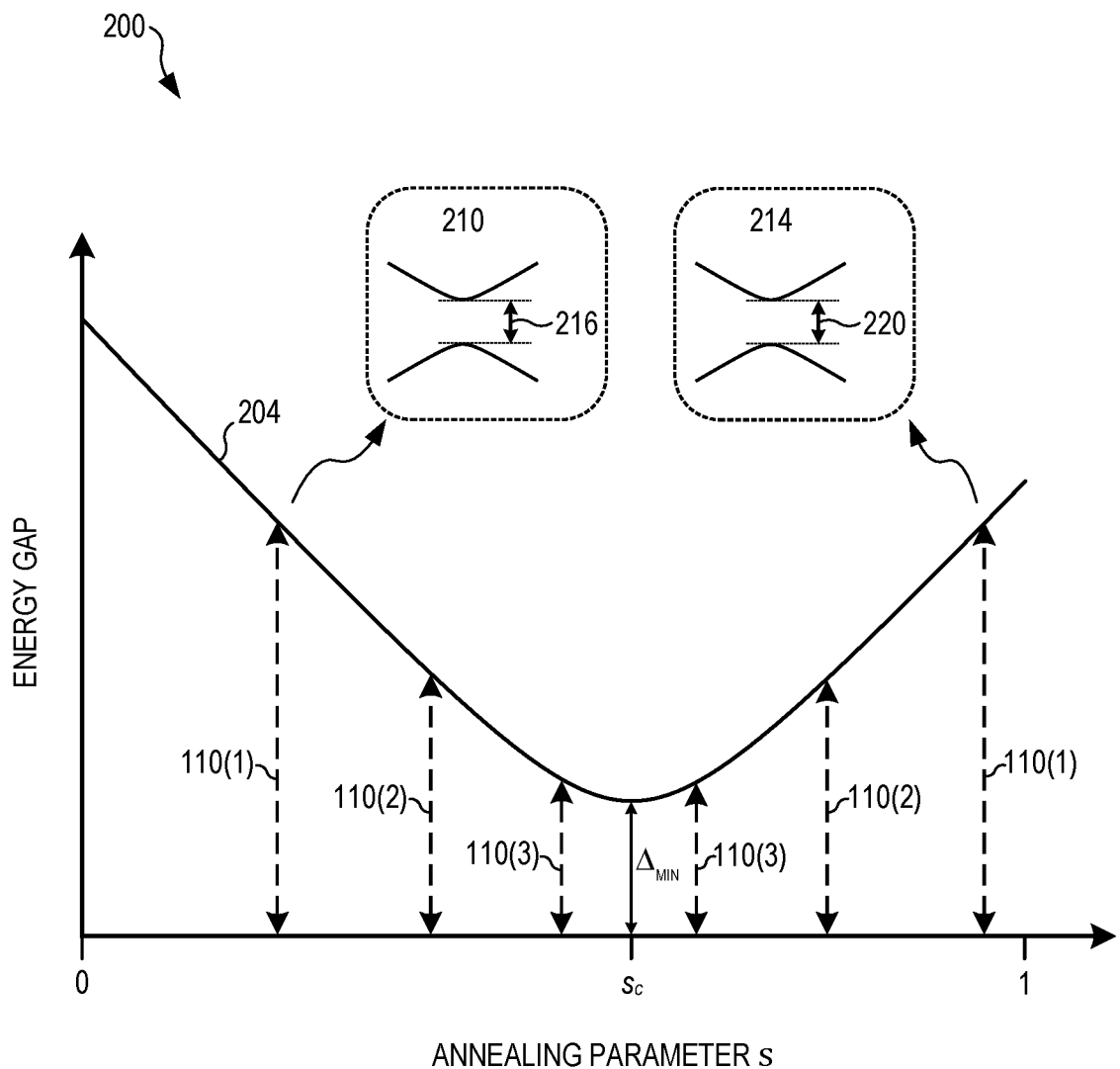
FIG. 3 shows the plot of FIG. 2 when a driver Hamiltonian includes several oscillating fields, in embodiments.

FIG. 3 shows plot 200 of FIG. 2 when driver Hamiltonian $\hat{H}_{D/M}(t)$ includes several oscillating fields 110. Each of oscillating fields 110 has a unique frequency such that at most one of oscillating fields 110 is resonant, or nearly resonant, with MBQS 100 at any value of annealing parameter s. FIG. 3 shows $N_F=3$ oscillating fields 110 coupling with MBQS 100 to generate a sequence of $2N_F=6$ avoided crossings (in addition to the one avoided crossing at phase transition $s_c$). For clarity, FIG. 3 only shows avoided crossings 210, 214 due to oscillating field 110(1). However, it should be understand that each of oscillating fields 110(2) and 110(3) generates two avoided crossings similar to avoided crossings 210, 214, but occurring at different values of annealing parameter s. MBQS 100 may be similarly driven with any other number $N_F$ of oscillating fields without departing from the scope hereof.

In embodiments, each frequency $f_i$ of oscillating fields 110 is selected from a frequency range $\{f_{min}, f_{max}\}$, where $f_{min}$ is a minimum frequency and $f_{max}$ is a maximum frequency. The minimum and maximum frequencies $f_{min}$ and $f_{max}$ may be chosen based on a problem class (typically, both $f_{min}$ and $f_{max}$ scale as $1/N_q$). For example, minimum frequency $f_{min}$ may be selected based on minimum energy gap $\Delta_{min}$ at critical point $s_c$, and maximum frequency $f_{max}$ may be selected based on an initial energy gap of energy gap 204 at s=0. In some of these embodiments, each frequency $f_i$ is randomly selected from the frequency range $\{f_{min}, f_{max}\}$. In one such embodiment, a probability density function for randomly selecting each frequency $f_i$ from the frequency range is a continuous uniform distribution over the frequency range. In other embodiments, the probability density function corresponds to another type of distribution.

In plot 200, the initial energy gap at s=0 is larger than the final energy gap at s=1. In this case, an oscillating field (e.g., one of oscillating fields 110) with a large frequency may only resonantly couple to MBQS 100 once, at a small value of annealing parameter, generating only one avoided crossing. Thus, each of oscillating fields 110 generates at least one avoided crossing, and at most two avoided avoided crossings, during annealing.

Figure 4:
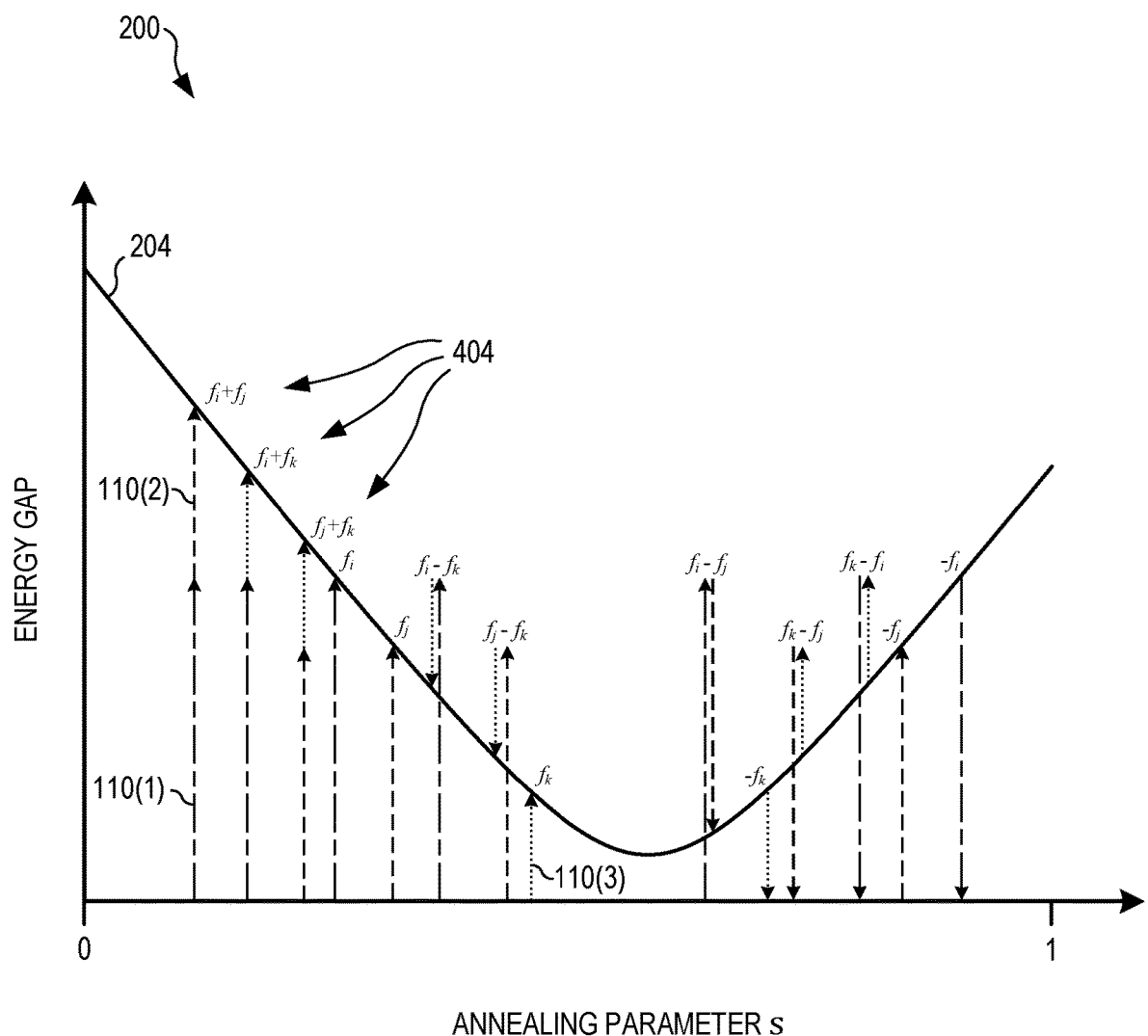
FIG. 4 shows the plot of FIG. 2 with three example oscillating fields cooperating to drive a plurality of multi-photon resonances, in embodiments.

FIG. 4 shows plot 200 with three example oscillating fields 110(1), 110(2), 110(3) cooperating to drive a plurality of multi-photon resonances 404. For each of multi-photon resonances 404, oscillating fields 110(1), 110(2), and/or 110(3) couple the ground and excited states to generate one additional avoided crossing that is similar to single-photon avoided crossings 210, 214 of FIGS. 2 and 3, but occurring at a different value of annealing parameter s. In FIG. 4, oscillating fields 110(1), 110(2), and 110(3) have respective frequencies $f_i$, $f_j$, and $f_k$, and each of multi-photon resonances 404 is labeled with a corresponding sum or difference of frequencies $f_i$, $f_j$, and $f_k$. For clarity, FIG. 4 only shows some of the one-photon and two-photon resonances, and none of the three-photon resonances, that may be driven with oscillating fields 110(1), 110(2), 110(3). As in FIG. 3, some of multi-photon resonances 404 may have a frequency sum so large as to only generate one avoided crossing near the larger initial energy gap (e.g., $f_i+f_j$ and $f_i+f_k$).

The strength of a multi-photon resonance decreases exponentially with a number of photons n forming a multi-photon resonance, reducing a gap size of the corresponding avoided crossing accordingly. However, there are $2^n \binom{N_F}{n}$ resonances for a given n. When all the resonances for all values of n are summed, the net effect is a reduction in a difficulty exponent for problems characterized by a hard first-order transition, providing a polynomial speedup over the case of no oscillating fields 110.

Physical Implementations

Each of qubits 102 is a two-level quantum mechanical system 112, or an approximation thereof. For example, each of qubits 102 may be a superconducting qubit having a pair of low-energy ground states that approximate two-level system 112. Examples of a superconducting qubit include a Josephson junction qubit, a charge qubit (e.g., a single Cooper pair box qubit, or a single Cooper pair transistor qubit), and a flux qubit (e.g., a radio-frequency (RF) superconducting quantum interference device (SQUID) qubit, a DC SQUID qubit, a double-SQUID qubit, or a three-junction SQUID persistent current qubit). Each of qubits 102 may be an atomic qubit using two internal energy levels of a neutral atom or molecule, either trapped or in free-space. The neutral atom may be a Rydberg atom. Each of qubits 102 may be an ionic qubit formed from two energy levels of an atomic or molecular ion, either trapped or in free-space. Each of qubits 102 may be formed from spin states of nuclei within molecules (i.e., nuclear magnetic resonance). Each of qubits 102 may a nitrogen-vacancy center in diamond, or another type of point defect in a crystal lattice. Alternatively, each of qubits 102 may be any other type of qubit known in the art without departing from the scope hereof.

Figure 5:
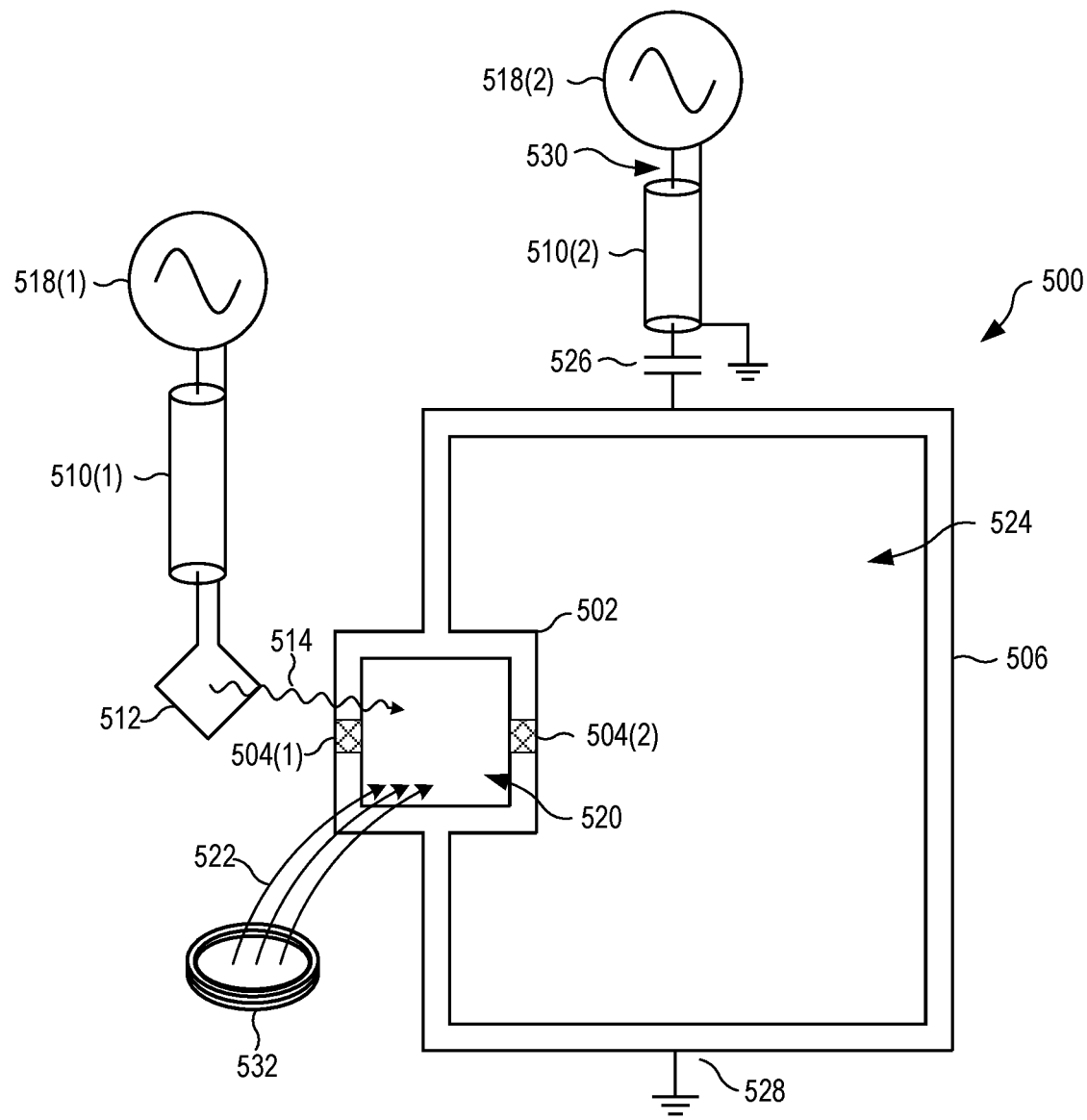
FIG. 5 shows one example of a superconducting flux qubit with which embodiments herein may be implemented, in embodiments.

FIG. 5 shows one example of a superconducting flux qubit 500 with which embodiments herein may be implemented. Flux qubit is one of qubits 102 of FIG. 1. Flux qubit 500 is a double SQUID qubit having a superconducting wire 506 that forms a qubit loop 524 interrupted by a SQUID 502 with two Josephson junctions 504(1), 504(2). To drive flux qubit 500 according to driver Hamiltonian $\hat{H}_H(t)$ of Eqn. 2, an oscillating flux 514 may be threaded through a SQUID loop 520 of SQUID 502. Oscillating flux 514 may be generated by an oscillating electrical current passing through a loop 512 inductively coupled with SQUID loop 520. An oscillator 518(1) supplies the electrical current to loop 512 via a transmission line 510(1). Oscillator 518(1) is one of oscillators 108 of FIG. 1. In FIG. 5, sizes of SQUID loop 520 and qubit loop 524 may not be shown to scale.

To drive flux qubit 500 according to driver Hamiltonian $\hat{H}_D(t)$ of Eqn. 1, an oscillating voltage 530 may be applied across SQUID 502. In FIG. 2, oscillator 518(2) outputs oscillating voltage 530 to a transmission line 510(2) capacitively coupled to superconducting wire 506 via a capacitor 526. To complete the electrical circuit, superconducting wire 506 is connected to ground at a ground point 528. Oscillator 518(2) is one of oscillators 108 of FIG. 1.

Driver coupling strength κ (see Eqns. 1 and 2) may be controlled via a static flux 522 threaded through SQUID loop 520. Unlike oscillating flux 514, static flux 522 is constant and/or slowly-varying in time compared to a period of oscillating flux 514. Static flux 522 may be generated, for example, by an electrical current flowing through a coil 532 inductively coupled to SQUID loop 520. The electrical current flowing through coil 532 may be changed over time according to annealing schedule s(t), thus changing coupling strength κ over time so as to implement instantaneous Hamiltonian $\hat{H}_I(s(t))$ of Eqn. 5.

In another embodiment, coil 532 is sized and positioned so as to minimize coupling of static flux 522 to qubit loop 524. In one embodiment where $\hat{H}_M(t)$ of Eqn. 1 is used as the driver Hamiltonian, loop 512 and coil 532 are separate loops, as shown in FIG. 5. In another embodiment using $\hat{H}_M(t)$, loop 512 is driven with an electrical current having a oscillating component that generates oscillating flux 514, and a slowly-varying component that generates static flux 522. Thus, in this embodiment, coil 532 is not needed, advantageously reducing size and complexity. In one embodiment where $\hat{H}_D(t)$ of Eqn. 2 is used as the driver Hamiltonian, loop 512 is driven with a static or slowly-varying current to produce static flux 522, instead of coil 532. In another embodiment using $\hat{H}_D(t)$, coil 532 produces static flux 522.

A flux-qubit Hamiltonian $\hat{H}_N$ of flux qubit 500 may be expressed in the phase φ basis as $$\hat{H}_{FQ} = \qquad (7)$$
$$4E_c\left(i\frac{\partial}{\partial\phi} + \frac{CV_e}{2e}\right)^2 + \frac{E_L}{2}\phi^2 - E_J(\cos(\phi+\Phi_S+\Phi_L) + \cos(\phi+\Phi_L)),$$

where $\Phi_S$ is a magnetic flux through SQUID loop 520 (e.g., static flux 522), $\Phi_L$ is magnetic flux 522 through qubit loop 524, $V_e$ is a voltage applied across SQUID 502 (e.g., oscillating voltage 530), $E_J$ is a Josephson energy, $E_C$ is a capacitive charging energy, $E_L$ is an inductive energy of a persistent current circulating in superconducting wire 506 around qubit loop 524, C is an equivalent capacitance of flux qubit 500, and e is the electron charge. For $\Phi_L$ near π, flux qubit 500 has two ground states with $\langle\phi\rangle = \pm\phi_A$ (for some $\phi_A$ that minimizes the potential terms), corresponding to clockwise and counterclockwise persistent currents. There is a large nonlinearity that separates these two ground states from higher-energy excited states, which are herein ignored.

At $\Phi_L = \pi$, the energy of the symmetric and antisymmetric superpositions have a tunneling energy splitting Δ which decreases exponentially in $E_J/E_C$. Biasing $\Phi_L$ away from π splits the degeneracy between the two states, and adjusting $\Phi_S$ lowers the tunneling barrier by reducing the effective $E_J$. Similarly, a static offset charge $CV_e/2e$ can be eliminated through a gauge transformation $|\psi\rangle \to e^{iCV_e/(2e)}|\psi\rangle$; however, if $V_e$ varies in time it can induce transitions between the two states. If a reduced basis is chosen such that the two persistent current states are eigenvalues of $\sigma_z$, $\hat{H}_{FQ}$ becomes $$\hat{H}_{FQ} \approx \Delta(\Phi_S)(\cos(cV_e)\sigma_x + \sin(cV_e)\sigma_y) + U(\Phi_L)\sigma_z, \qquad (8)$$

where c is a proportionality constant. Eqn. 8 shows that the transverse amplitude oscillations of $\hat{H}_M(t)$ can be generated by oscillating $\Phi_S$ (e.g., oscillating flux 514 of FIG. 5), and the transverse directional oscillations of $\hat{H}_D(t)$ can be generated by oscillating $V_e$ (e.g., oscillating voltage 530 of FIG. 5).

Oscillating voltage 530 may be represented as $V_e(t) = \bar{\alpha} \sin(2\pi ft)$, where $\bar{\alpha}$ is a raw amplitude. Inserting this form into Eqn. 8 shows that $V_e(t)$ appears in the arguments of the sine and cosine terms. Thus, flux qubit 500 modulates $V_e(t)$ to generate a series of odd harmonics of the frequency f. Each of the harmonics may drive transitions in MBQS 100, either by itself or as one component of a multi-photon resonance. Thus, an amplitude $\alpha_i$ of each harmonic will be less than raw amplitude $\bar{\alpha}$.

An optimal value of $\bar{\alpha}$, denoted herein as $\alpha_m$, may be found by expansion:

$$\sin(\bar{\alpha} \sin(2\pi ft)) = g_1 e^{2\pi i ft} + g_3 e^{2\pi i (3f)t} + \ldots + H.c. \qquad (9)$$

While all terms in Eqn. 9 may contribute to driving of many-photon transitions, in practice terms at fifth order (i.e., at a frequency 5f) and higher are negligible, and thus ignored herein. Optimum raw amplitude $\alpha_m$ may be found by maximizing $g_1(\bar{\alpha})^2 + g_3(\bar{\alpha})^2$, since both terms enter quadratically into the sum of many-photon transitions. The result is $\alpha_m \approx 1.18$ for $\bar{\alpha} \approx 0.59\pi \approx 1.85$. Values of $\bar{\alpha}$ larger than this are counterproductive as they produce weaker coefficients at low orders and increase the possibility of generating off-resonant excitations.

The modulation of $V_e(t)$ is reflected in $\hat{H}_{FQ}$ (see Eqn. 8) and thus is inherent to the dynamics of flux qubits. However, other physical implementations of qubits 102 may not produce such modulation inherently. For example, when each qubit is formed from two energy levels of an atom or ion, each of oscillating fields 110 may be a free-space electromagnetic wave (e.g., laser beam or microwave) coupling the two energy levels. In this case, each of oscillating fields 110 may be modulated to generate a plurality of harmonics that couple with one of qubits 102. The modulation applied to oscillating fields 110 may be phase modulation, frequency modulation, amplitude modulation, or any other type of nonlinear modulation known to generate harmonics.

In one embodiment, oscillating flux 514 is threaded through SQUID loop 520 and oscillating voltage 530 is applied across SQUID 502, thereby implementing both $\hat{H}_M(t)$ and $\hat{H}_D(t)$ simultaneously with one qubit. The frequencies of oscillating flux 514 and oscillating voltage 530 may be different so as to generate additional avoided crossings during annealing.

Figure 6:
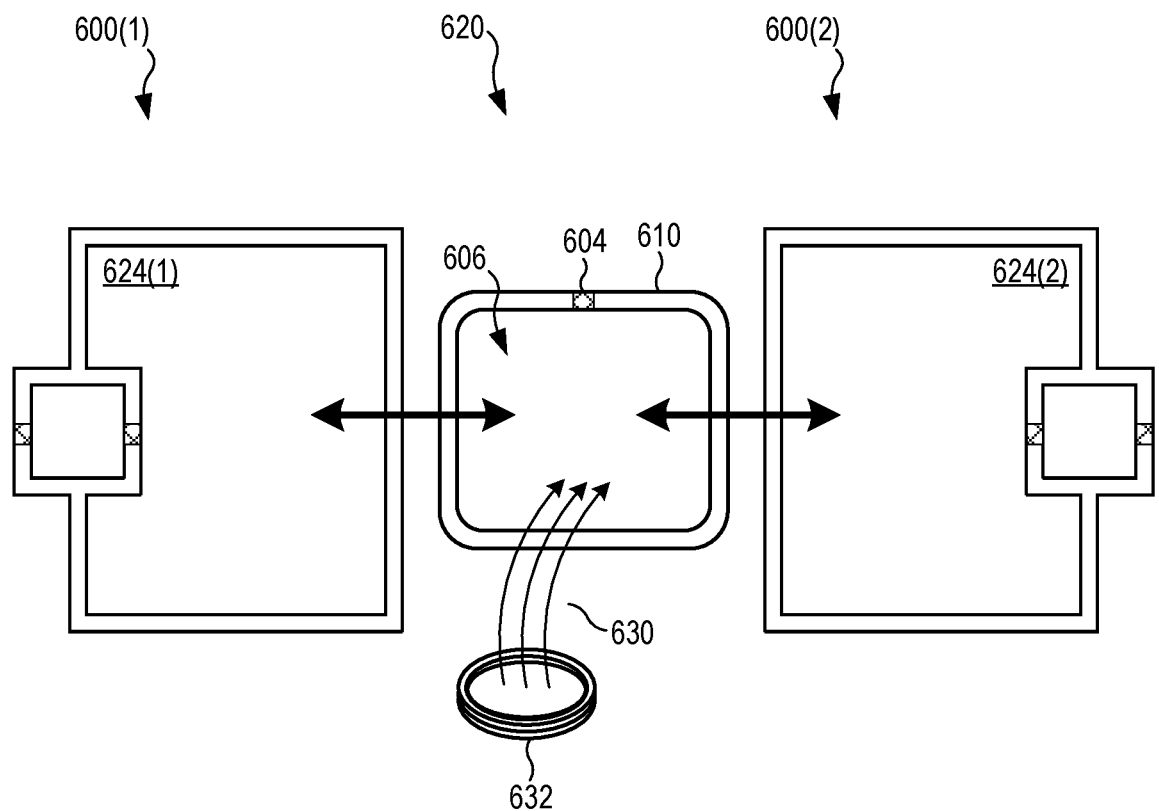
FIG. 6 shows one example of a longitudinal interqubit coupling that couples a first qubit and a second qubit, in an embodiment.

FIG. 6 shows one example of a longitudinal interqubit coupling 620 that couples a first qubit 600(1) and a second qubit 600(2). First qubit 600(1) has a first qubit loop 624(1), and second qubit 600(2) has a second qubit loop 624(2). Each of first and second qubits 600(1), 600(2) is one superconducting flux qubit 500 of FIG. 5. Interqubit coupling 620 has a superconducting wire 610 forming a coupling loop 606 interrupted by a Josephson junction 604. Interqubit coupling 620 is sized and positioned such that coupling loop 606 inductively couples to first and second qubit loops 624(1), 624(2). A coupling strength $J_{zz}$ of interqubit coupling 620 may be controlled via a static flux 630 threaded through coupling loop 606. Static flux 630 may be generated, for example, by an electrical current flowing through a coil 632 inductively coupled to coupling loop 606. The electrical current flowing through coil 632 may be changed over time according to annealing schedule s(t), thus changing coupling strength $J_{zz}$ over time so as to implement one interqubit coupling term of problem Hamiltonian $\hat{H}_P$ according to instantaneous Hamiltonian $\hat{H}_I(s(t))$ of Eqn. 5. In FIG. 1, a size of interqubit coupling 620 may not be shown to scale relative to sizes of first and second qubits 600(1), 600(2).

Grouping Qubits

Figure 7:
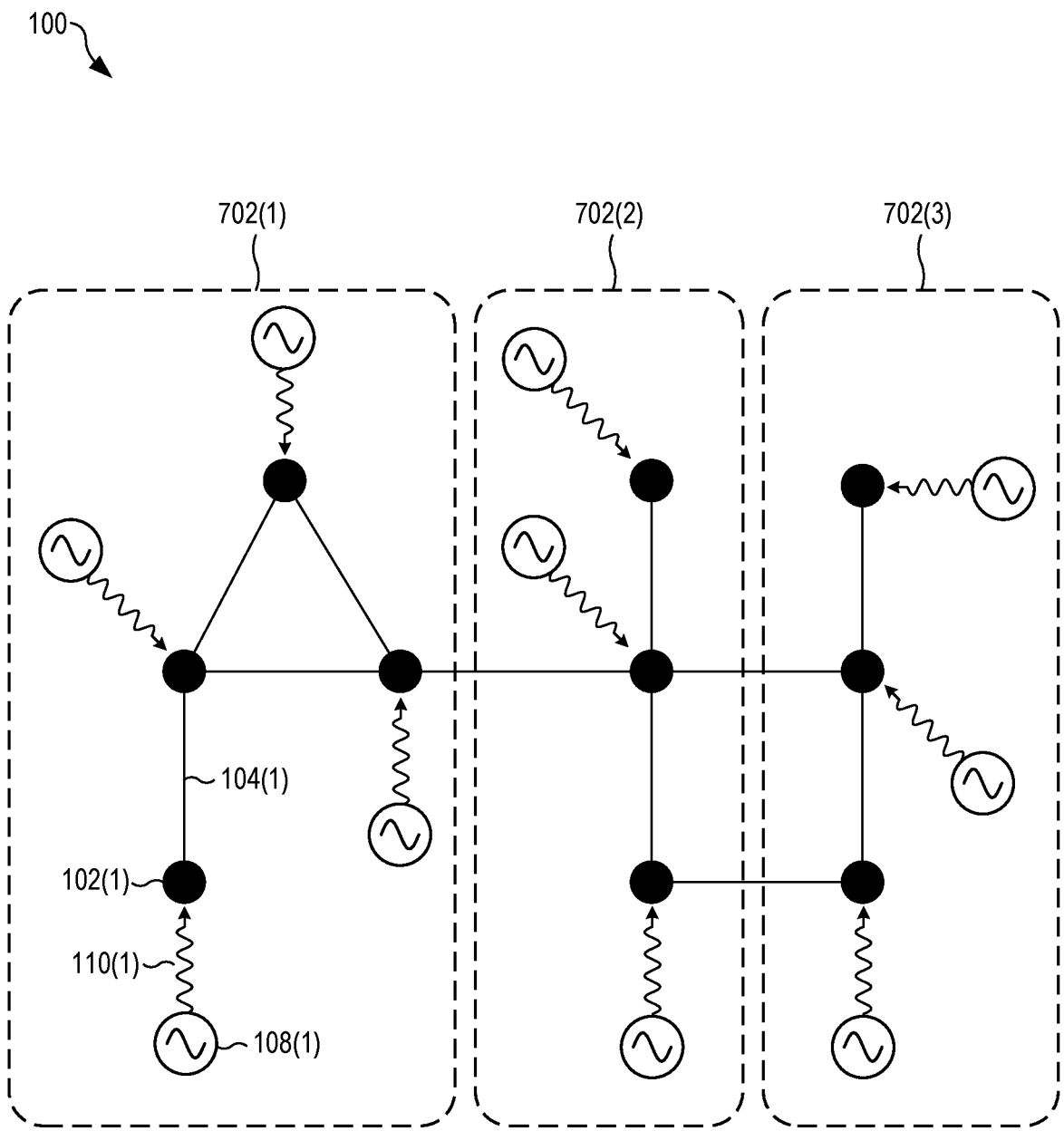
FIG. 7 shows the MBQS of FIG. 1 with qubits and oscillating fields divided into three groups, in embodiments.

FIG. 7 shows MBQS 100 of FIG. 1 with qubits 102 and oscillating fields 110 divided into three groups 702(1), 702(2), and 702(3). Specifically, first group 702(1) contains four of qubits 102 and four of oscillating fields 110, and each of second group 702(2) and third group 702(3) contain three of qubits 102 and three of oscillating fields 110. In some embodiments, all of oscillating fields 110 of one group have an identical frequency and an identical phase. As described in more detail below in the subsection "Phase-Locking Tones", synchronizing the frequencies and phases of oscillating fields 110 of one group advantageously drives qubits 102 of said one group such that oscillations of the transverse fields interfere constructively, boosting a strength of the driving term.

In one embodiment, oscillators 108 generating oscillating fields 110 one group (i.e., one of groups 702) are phase-locked (e.g., to common reference frequency), such that said oscillating fields 110 have the identical frequency and the identical phase of said one group. In another embodiment, all of oscillating fields 110 of said one group are generated by one of oscillators 108, wherein a power splitter divides the one output of said one of oscillators 108 into a number of identical outputs that drive qubits 102 of said one group. The identical frequency may vary between groups 702, such that each of groups 702 is assigned a distinct frequency.

Figure 8:
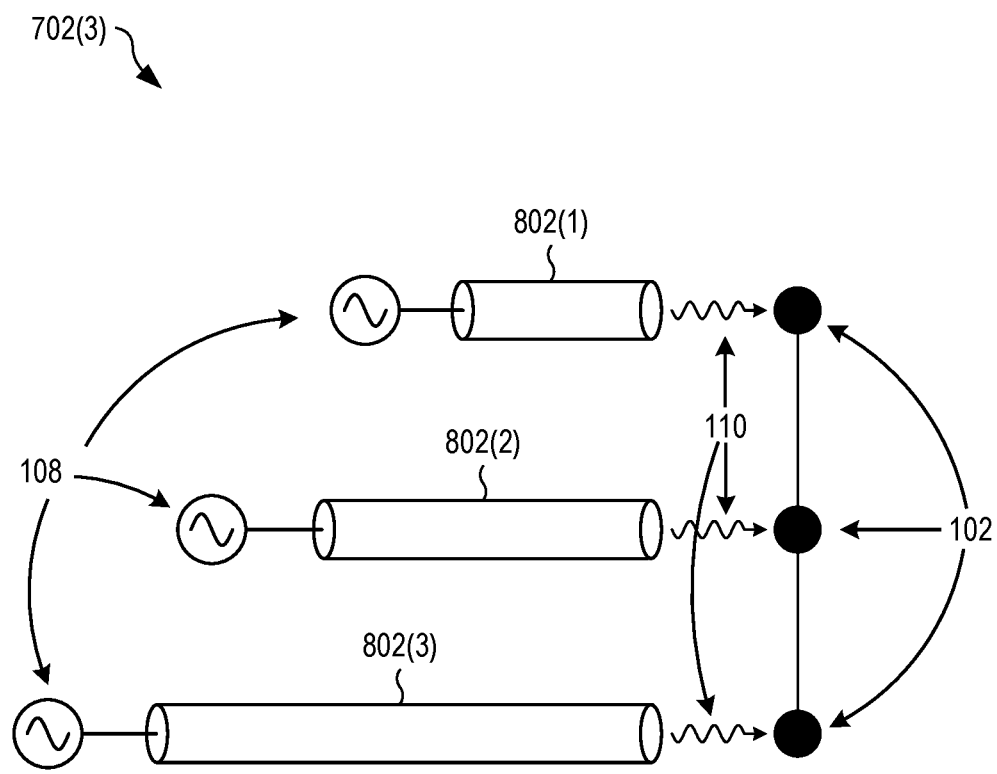
FIG. 8 shows one of the three groups of FIG. 7, wherein three qubits are driven by three oscillating fields generated by three oscillators, in embodiments.

FIG. 8 shows third group 702(3) of FIG. 7, wherein three of qubits 102 are driven by three of oscillating fields 110 generated by three of oscillators 108. The three oscillating fields 110 are transmitted to the three qubits 102 via three transmission lines 802(1), 802(2), and 802(3). As shown in FIG. 8, lengths of transmission lines 802(1), 802(2), and 802(3) may be unequal, introducing phase shifts of oscillating fields 110 that arise from different propagation times of oscillating fields 110 along transmission lines 802. In one embodiment, a phase offset of each of oscillators 108 is adjusted such that oscillating fields 110 have an identical phase after transmission lines 802, thereby ensuring that oscillating fields 110 interfere constructively at qubits 102.

Transverse Interqubit Couplings

Advantageously, modulating transverse interqubit couplings, at frequencies distinct from those of oscillating fields 110 driving qubits 102 directly, drives additional single-photon and multi-photon resonances of MBQS 100, thereby allowing annealing of MBQS 100 to proceed faster. Since the corresponding speedup scales exponentially with a number of tones, modulating transverse interqubit couplings in addition to qubits (e.g., qubits 102) may significantly improve the speedup.

Figure 9:
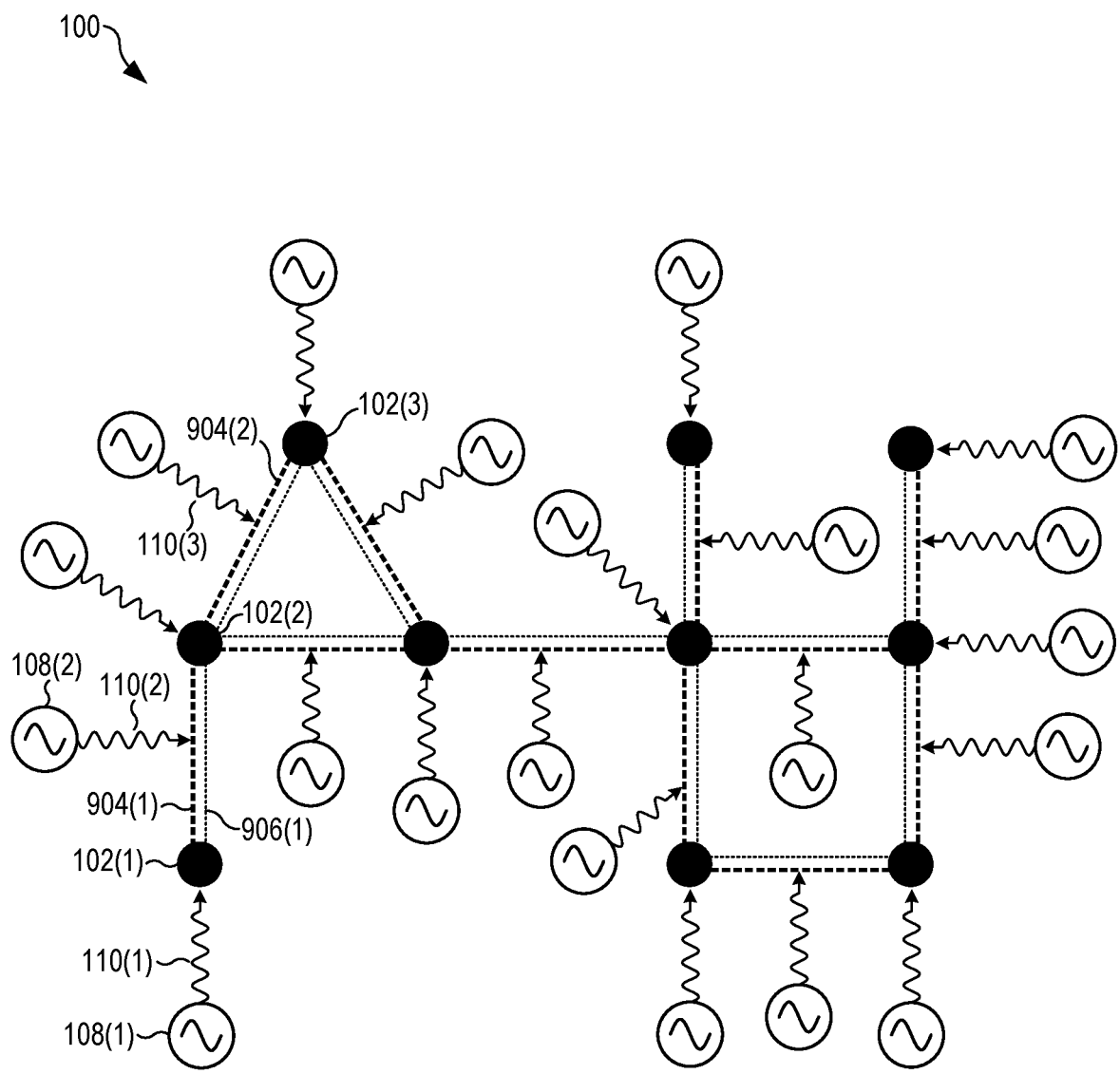
FIG. 9 shows the MBQS of FIG. 1 with multiple interqubit couplings between pairs of qubits, in an embodiment.

FIG. 9 shows MBQS 100 of FIG. 1 with multiple interqubit couplings between pairs of qubits 102. More specifically, interqubit couplings 104 of FIG. 1 are shown in FIG. 9 as longitudinal interqubit couplings 906 and transverse interqubit couplings 904. Each of longitudinal interqubit couplings 906 represents one longitudinal interqubit coupling term of Eqn. 3. Similarly, each of transverse interqubit couplings 904 represents one transverse interqubit coupling term of Eqn. 3. However, a pair of qubits 102 may have several transverse interqubit couplings 904 (e.g., fully transverse interqubit coupling and partially transverse interqubit coupling), as described above in reference to Eqn. 3.

FIG. 9 also shows additional oscillators 108 driving transverse interqubit couplings 904 with additional oscillating fields 110 so as to modulate transverse interqubit couplings 904. For example, oscillator 108(2) generates oscillating field 110(2) that modulates transverse interqubit coupling 904(1). Some of oscillators 108 drive qubits 102, as in FIG. 1 (e.g., oscillator 108(1) drives qubit 102(1) with oscillating field 110(1)).

Figure 10:
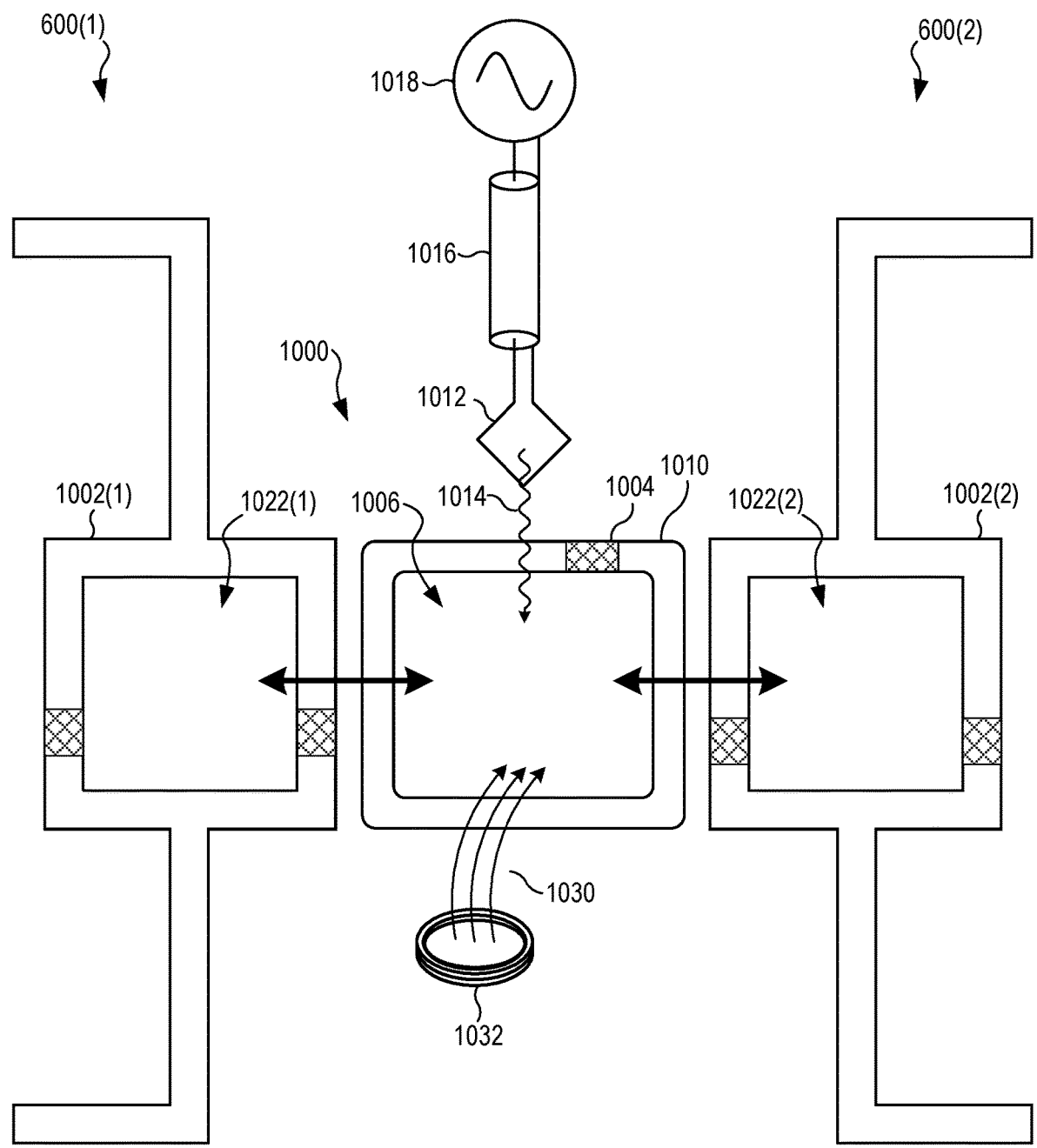
FIG. 10 shows one example of a transverse interqubit coupling that transversely couples a first qubit and a second qubit, in an embodiment.

FIG. 10 shows one example of a transverse interqubit coupling 1000 that transversely couples first qubit 600(1) and second qubit 600(2). Each of first and second qubits 600(1), 600(2) is one of qubits 102 of FIG. 9, and transverse interqubit coupling 1000 is one of transverse interqubit couplings 904 of FIG. 9. Transverse interqubit coupling 1000 has a superconducting wire 1010 forming a transverse coupling loop 1006 interrupted by a Josephson junction 1004. Transverse interqubit coupling 1000 is sized and positioned such that transverse coupling loop 1006 inductively couples to a first SQUID loop 1022(1) of first qubit 600(1) and a second SQUID loop 1022(2) of second qubit 600(2).

As shown in FIG. 10, transverse interqubit coupling 1000 corresponds to one fully transverse interqubit coupling term $J_{x,x}\sigma_x \otimes \sigma_x$ of the problem Hamiltonian of Eqn. 3, where $J_{x,x}$ is a transverse coupling strength. For clarity, transverse coupling strength $J_{x,x}$ may be expressed as a sum of a static component $J_{x,x}^{(DC)}$ and an oscillating component $J_{x,x}^{(AC)} \sin(2\pi ft)$, where f is a frequency of the oscillating component. Thus, $J_{x,x} = J_{x,x}^{(DC)} + J_{x,x}^{(AC)} \sin(2\pi ft)$. Coupling strength $J_{x,x}$ may be controlled via a magnetic flux threaded through transverse coupling loop 1006. The magnetic flux may have an oscillating component (e.g., oscillating flux 1014) whose amplitude corresponds to $J_{x,x}^{(AC)}$ and a static component (e.g., static flux 1030) that varies slowly in time, as compared to a period of the oscillating component, corresponding to $J_{x,x}^{(DC)}$.

Transverse interqubit coupling 1000 may be modulated by threading oscillating flux 1014 through transverse coupling loop 1006. Oscillating flux 1014 may be generated, for example, by an oscillating electrical current passing through a loop 1012 inductively coupled with transverse coupling loop 1006. An oscillator 1018 may supply the electrical current to loop 1012 via a transmission line 1016. Oscillator 1018 is one of oscillators 108 driving one of transverse interqubit couplings 904 (e.g., oscillator 108(2) of FIG. 9).

Static flux 1030 may be generated, for example, by an electrical current flowing through a coil 1032 inductively coupled to transverse coupling loop 1006. The electrical current flowing through coil 1032 may be changed over time according to annealing schedule s(t), thus changing static coupling strength $J_{x,x}^{(DC)}$ over time so as to implement one transverse interqubit coupling term of problem Hamiltonian $H_P$ according to instantaneous Hamiltonian $\hat{H}_I(s(t))$ of Eqn. 5. In FIG. 10, dimensions of transverse interqubit coupling 1000 may not be shown to scale relative to sizes of first and second SQUID loops 1022(1), 1022(2).

In one embodiment, loop 1012 and coil 1032 are separate, as shown in FIG. 10. In one of these embodiments, coil 1032 is sized and positioned so as to minimize coupling of static flux 1030 to first and second qubits 600(1), 600(2) (e.g., first and second SQUID loops 1022(1), 1022(2)). In another embodiment, loop 1012 is driven with an electrical current having a oscillating component that generates oscillating flux 1014, and a slowly-varying component that generates static flux 1030. Thus, in this embodiment, coil 1032 is not needed, advantageously reducing size and complexity.

In one embodiment, transverse coupling loop 1006 of transverse interqubit coupling 1000 is inductively coupled to one SQUID loop (e.g., one of SQUID loops 1022(1) and 1022(2) of FIG. 10) and one qubit loop (e.g., one of qubit loops 624(1) and 624(2) of FIG. 6), thereby implementing one partially transverse interqubit coupling term of the form $J_{x,z}\sigma_x \otimes \sigma_z$ or $J_{z,x}\sigma_z \otimes \sigma_x$, of the problem Hamiltonian of Eqn. 3.

With transverse interqubit coupling expressed as a sum of oscillating and static components, the corresponding transverse interqubit coupling term is $$(J_{x,x}^{(DC)} + J_{x,x}^{(AC)} \sin(2\pi ft))(\sigma_x^{(1)} \otimes \sigma_x^{(2)}) = (J_{x,x}^{(DC)} + J_{x,x}^{(AC)} \sin(2\pi ft))\sigma_x^{(1)} \otimes (J_{x,x}^{(DC)} + J_{x,x}^{(AC)} \sin(2\pi ft))\sigma_x^{(2)}, \quad (10)$$

where the superscript of each operator σ denotes which of qubits 600 said operator is applied to. Eqn. 10 shows that oscillating flux 1014 drives first qubit 600(1) transversely so as to couple the two states of first qubit 600(1), and drives second qubit 600(2) transversely so as to couple the two states of second qubit 600(2). Thus, transverse interqubit coupling 1000, when modulated by oscillating flux 1014, produces an avoided crossing similar to that generated when oscillating field 110(1) drives first qubit 102(1) directly (e.g., first and second avoided crossings 210, 214 of FIGS. 2 and 3). For proper choices of $J_{x,x}^{(DC)}$ and $J_{x,x}^{(AC)}$, Eqn. 10 takes the form of two of the terms of $\hat{H}_M(t)$ of Eqn. 2 (i.e. for qubits i=1 and i=2), and thus corresponds to driving of qubits 102 in a manner similar to that implemented with Hamiltonian $\hat{H}_M(t)$.

Transverse interqubit couplings may also be driven with an oscillating field whose direction rotates in the transverse x-y plane, thereby replicating driving of qubits with Hamiltonian $\hat{H}_D(t)$ of Eqn. 1. Referring to FIG. 9, a second qubit 102(2) is transversely coupled to a first qubit 102(1) via a first transverse interqubit coupling 904(1), and transversely coupled to a third qubit 102(3) via a second transverse interqubit coupling 904(2). First transverse interqubit coupling 904(1) may be driven with a first oscillating field 110(2) and second transverse interqubit coupling 904(2) may be driven with a second oscillating field 110(3). When first interqubit coupling 904(1) is a fully transverse coupling of the form $J_{x,x}\sigma_x \otimes \sigma_x$, first interqubit coupling 904(1) may be represented mathematically by Eqn. 10. When second interqubit coupling 904(2) is a fully transverse coupling of the form $J_{y,y}\sigma_y \otimes \sigma_y$, second interqubit coupling 904(2) may be represented mathematically by Eqn. 10, but with each $\sigma_x$ operator replaced with a corresponding $\sigma_y$ operator. When first and second oscillating fields 110(1), 110(2) drive first and second transverse interqubit couplings 904(1), 904(2), respectively, with an identical amplitude J and 90° out-of-phase, first and second transverse interqubit couplings 904(1), 904(2) may be represented mathematically as $$J\sin(2\pi ft)(\sigma_x^{(1)} \otimes \sigma_x^{(2)}) + J\cos(2\pi ft)(\sigma_y^{(2)} \otimes \sigma_y^{(3)}) = J(\sin(2\pi ft)\sigma_x^{(2)} + \cos(2\pi ft)\sigma_y^{(2)}) + J\sin(2\pi ft)\sigma_x^{(1)} + J\cos(2\pi ft)\sigma_y^{(3)} \quad (11)$$

where the superscript of each operator σ denotes which of qubits 102 said operator is applied to. The first term on the right-hand side of Eqn. 11 drives second qubit 102(2) with an oscillating field having a constant amplitude J and a direction that rotates in the transverse x-y plane at a frequency f. For clarity, static transverse coupling is ignored in Eqn. 10.

In some embodiments, transverse interqubit couplings 904 are not used to implement problem Hamiltonian $\hat{H}_P$, as in Eqn. 4. In one of these embodiments, oscillating components of transverse intraqubit coupling strengths may be changed over time according to annealing schedule s(t). In another of these embodiments, transverse intraqubit coupling strengths are changed over time according to a second annealing schedule different from annealing schedule s(t). For example, the second annealing schedule may begin after initial time $t_0$ of annealing schedule s(t), and/or end before final time $t_f$ of annealing schedule s(t). At the end of annealing, the oscillating component of all transverse intraqubit coupling strengths may be zero, in accordance with the problem Hamiltonian.

In other embodiments, static components of transverse interqubit couplings 904 are used to implement problem Hamiltonian $\hat{H}_P$, as shown in Eqn. 3. In one of these embodiments, each of transverse interqubit couplings 904 is modulated only at a beginning part of annealing (e.g., before reaching critical point $s_c$). During a latter part of annealing (e.g., after critical point $s_c$), the modulating is stopped and the static components of the transverse intraqubit couplings (e.g., $J_{x,x}^{(DC)}$ of Eqn. 10) are ramped up to their final values in accordance with the desired problem Hamiltonian. Thus, oscillating components of the transverse interqubit couplings may be changed according to a second annealing schedule different from annealing schedule s(t).

Annealing from a Low-Energy State of the Problem Hamiltonian

In some embodiments, quantum annealing begins with MBQS 100 in a known low-energy state of problem Hamiltonian $\hat{H}_P$, with the the goal finding an even lower-energy state of problem Hamiltonian $\hat{H}_P$. Thus, in these embodiments, annealing proceeds such that problem Hamiltonian $\hat{H}_P$ is "on" through the entire annealing cycle. More specifically, instantaneous Hamiltonian $\hat{H}_I$ may be expressed $$\hat{H}_I(s(t)=s(t)\hat{H}_{D/M}(t)+\hat{H}_P. \quad (12)$$

Unlike examples above, where annealing schedule s(t) is a linear ramp (see Eqn. 5), annealing schedule s(t) in Eqn. 12 has an initial value $s(t_0=0)=0$ at initial time $t_0=0$, and a final value $s(t_f)=0$ at final time $t_f$. Thus, annealing begins and ends with instantaneous Hamiltonian $\hat{H}_I$ equal to problem Hamiltonian $\hat{H}_P$.

Figure 11:
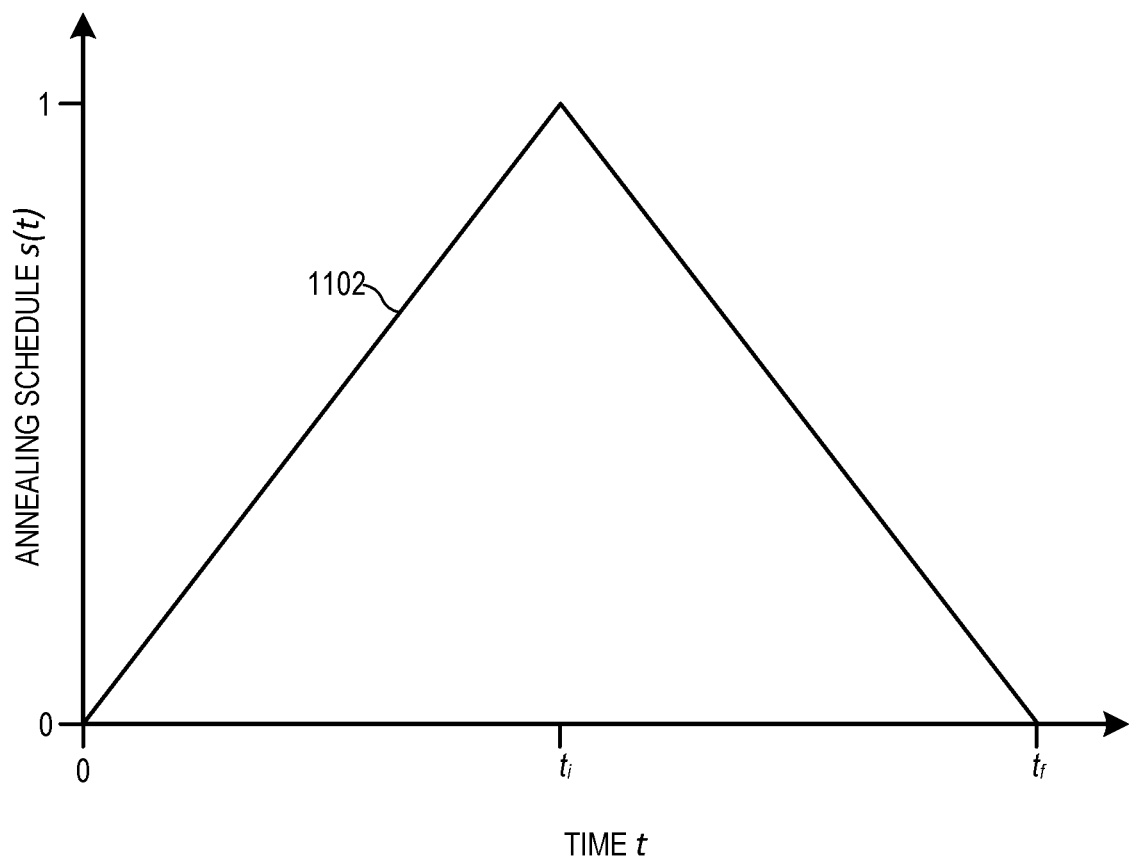
FIG. 11 shows one example of an annealing schedule that may be used for annealing that starts in a known state of the problem Hamiltonian, in embodiments.

FIG. 11 shows one example of an annealing schedule 1102 that may be used for annealing that starts in a known state of the problem Hamiltonian. Thus, annealing schedule 1102 may serve as s(t) in Eqn. 11. Annealing schedule 1102 forms one cycle of a triangle wave, increasing from 0 to 1 between initial time $t_0=0$ and an intermediate time $t_i$, and decreasing back to 0 between intermediate time $t_i$ and final time $t_f$. Intermediate time $t_i$ may be chosen such that $\hat{H}_{D/M}(t)$ ramps up slow enough to minimize heating of MBQS 100. Near intermediate time $t_i$, $\hat{H}_{D/M}(t)$ interacts strongly with MBQS 100, generating quantum fluctuations that encourage MBQS 100 to tunnel out of a local minimum corresponding to the initial state of problem Hamiltonian $\hat{H}_P$ and into another local minimum corresponding to a lower-energy state of problem Hamiltonian $\hat{H}_P$. It should be recognized that between intermediate time $t_i$ and final time $t_f$, annealing schedule 102 is identical to the linear ramp described above with reference to Eqn. 5. Although FIG. 11 shows intermediate time $t_i$ as occurring halfway between initial time $t_0=0$ and final time $t_f$, intermediate time $t_i$ may occur anywhere between $t_0$ and $t_f$.

ADDITIONAL EMBODIMENTS

Figure 12:
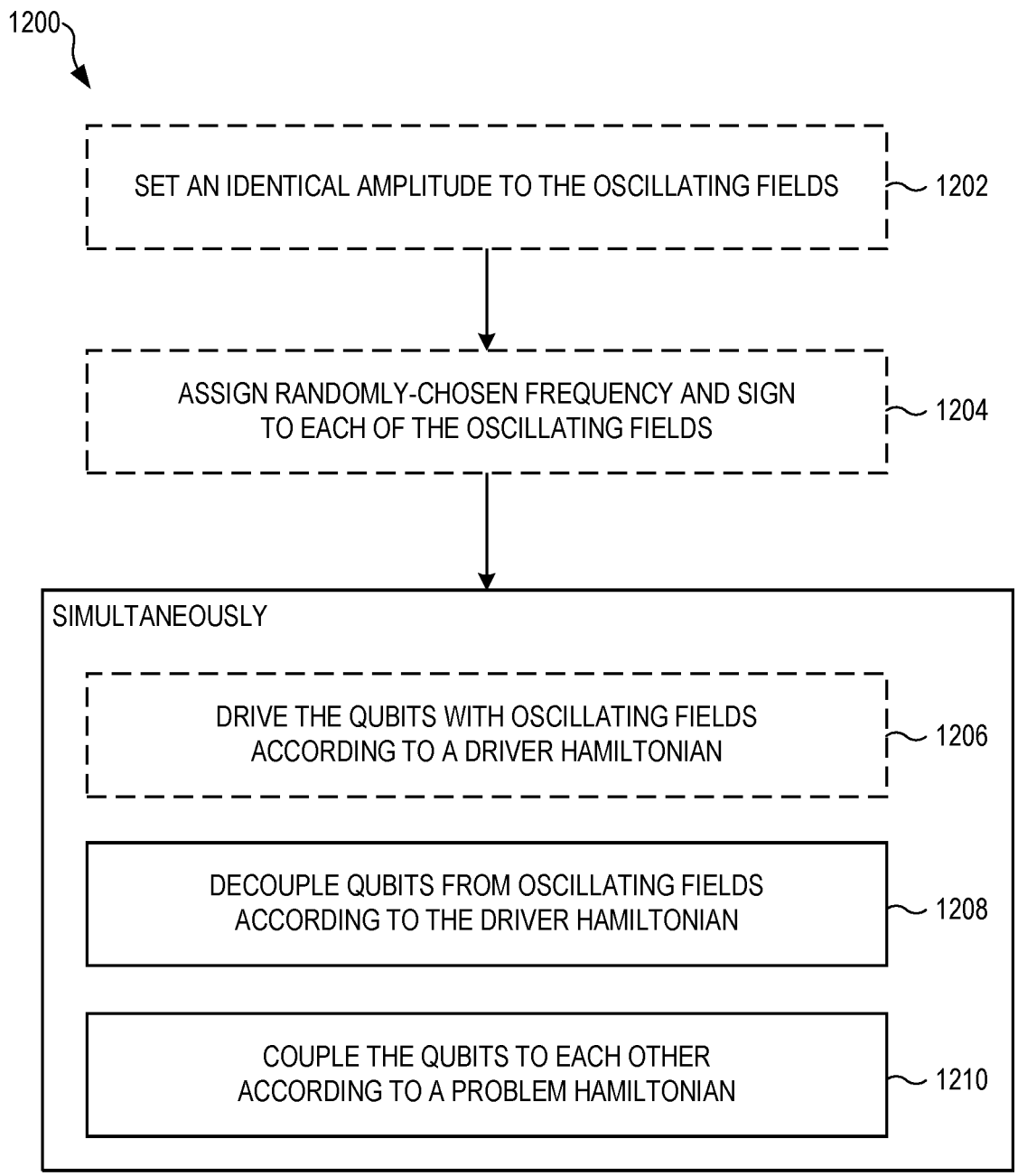
FIG. 12 shows one example of a first quantum annealing method, in embodiments.

FIG. 12 shows one example of a quantum annealing method 1200. Method 1200 may be implemented with MBQS 100 of FIG. 1. Method 1200 includes a step 1208 of decoupling qubits from oscillating fields that drive the qubits according to a driver Hamiltonian, and a step 1210 of coupling the qubits to each other according to a problem Hamiltonian. In one example of step 1208, static magnetic flux 522 of FIG. 5 is changed over time according to annealing schedule s(t) so as to reduce coupling of qubit 500 to oscillating field 514. In one example of step 1210, static flux 630 of FIG. 6 is changed over time according to annealing schedule s(t) so as to increase interqubit coupling strength between first and second qubits 600(1), 600(2). Steps 1208 and 1210 may occur simultaneously, as indicated in FIG. 12, thereby implementing instantaneous Hamiltonian $\hat{H}_I$ of Eqn. 5. In some embodiments, method 1200 includes a step 1206 of driving the qubits with the oscillating fields according to the driver Hamiltonian so that each of the oscillating fields drives one of the qubits. As an example of step 1206, FIG. 1 shows each of qubits 102 being driven by one of oscillating fields 110. Step 1206 may occur simultaneously with steps 1208 and 1210, as indicated in FIG. 12.

In other embodiments, method 1200 includes a step 1202 of setting an identical amplitude to the oscillating fields, and a step 1204 of assigning a randomly-chosen frequency and a randomly-chosen sign of the identical amplitude to each of the oscillating fields. In one of these embodiments, assigning the randomly-chosen frequency includes assigning a distinct randomly-chosen frequency to each of the oscillating fields. In another of these embodiments, method 1200 includes a step of randomly selecting the distinct randomly-chosen frequency from a frequency range chosen according to a problem class of the problem Hamiltonian.

Figure 13:
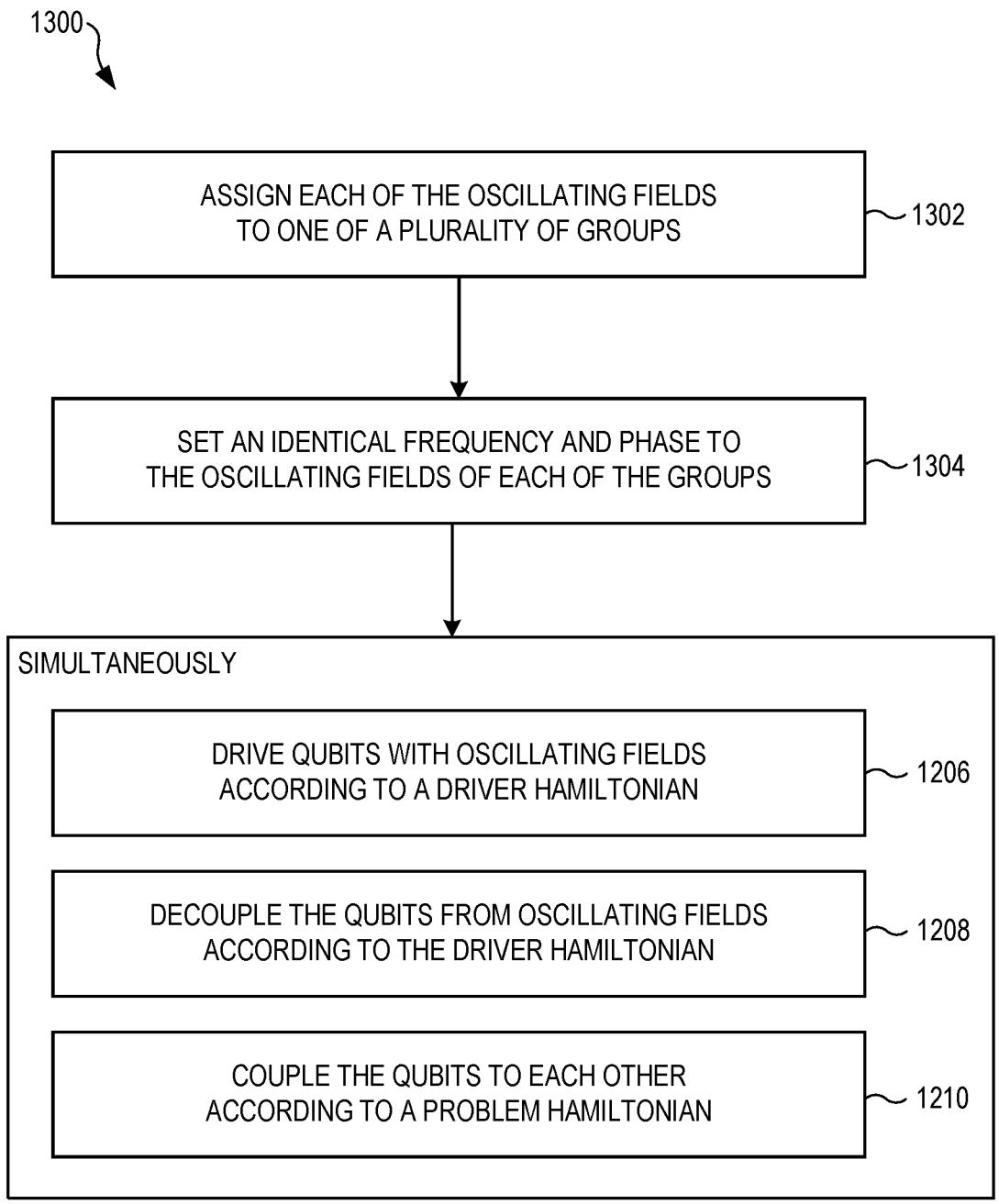
FIG. 13 shows one example of a second quantum annealing method, in embodiments.

FIG. 13 shows one example of a quantum annealing method 1300. Method 1300 includes a step 1302 of assigning each of a plurality of oscillating fields to one of a plurality of groups. FIG. 7 shows one example of step 1302, wherein each of oscillating fields 110 is assigned to one of three groups 702(1), 702(2), and 702(3). Method 1300 also includes a step 1304 of setting an identical frequency and an identical phase to the oscillating fields of each of the groups. Method 1300 also includes steps 1206, 1208, and 1210 of method 1200. Similar to method 1200, steps 1206, 1208, and 1210 may occur simultaneously, as indicated in FIG. 13, thereby implementing instantaneous Hamiltonian $\hat{H}_I$ of Eqn. 5.

Figure 14:
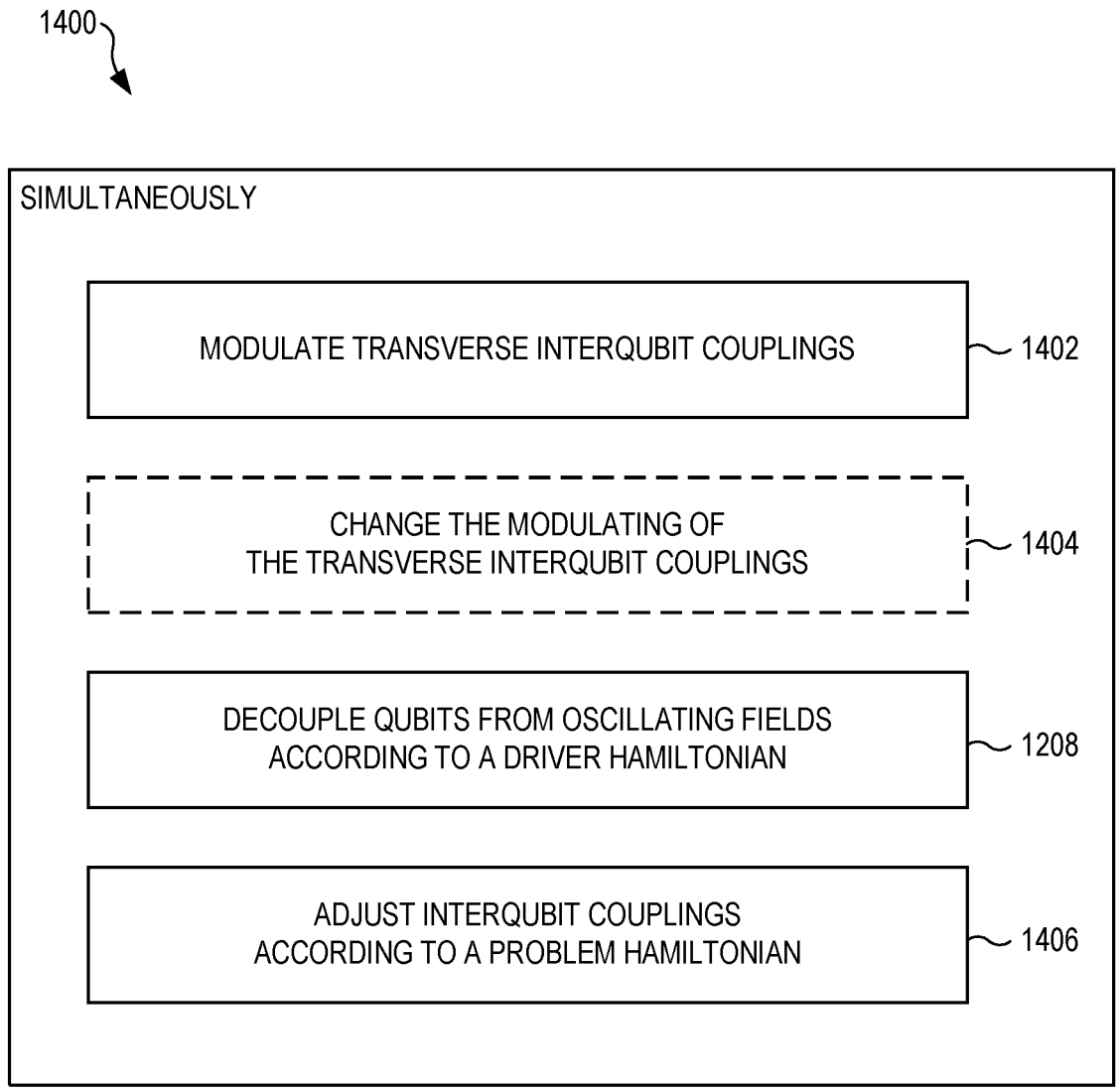
FIG. 14 shows one example of a third quantum annealing method, in embodiments.

FIG. 14 shows one example of a quantum annealing method 1400. Method 1400 includes a step 1402 of modulating a plurality of transverse interqubit couplings, of a plurality of interqubit couplings, that transversely couple the qubits to each other. In one example of step 1402, some of oscillators 108 of FIG. 9 drive transverse interqubit couplings 904 that transversely couple qubits 102 to each other, so as to modulate transverse interqubit couplings 904. In another example of step 1402, oscillating flux 1014 of FIG. 10 couples to coupling loop 1006 of transverse interqubit coupling 1000 to modulate the transverse coupling strength between first and second qubits 600(1), 600(2). Method 1400 also includes step 1208 of method 1200. Method 1400 also includes a step 1406 of adjusting a plurality of interqubit couplings that couple the qubits to each other according to the problem Hamiltonian. In one example of step 1406, static flux 630 of FIG. 6 is changed over time according to annealing schedule s(t) so as to increase interqubit coupling strength between first and second qubits 600(1), 600(2). Thus, "adjusting" an interqubit coupling means changing a static component of said interqubit coupling (e.g., $J_{x,x}^{(DC)}$ of Eqn. 10), and "modulating" an interqubit coupling means creating an oscillating component of said interqubit coupling (e.g., $J_{x,x}^{(AC)}$ of Eqn. 10).

In one embodiment, method 1400 includes a step 1404 that changes the modulating of the transverse interqubit couplings. In one example of step 1404, an amplitude of oscillating flux 1014 of FIG. 10 is changed over time to change an amplitude of the oscillating component of transverse interqubit coupling 1000. In the example of FIG. 14, steps 1402, 1404, 1208, and 1406 occur simultaneously. In another embodiment, steps 1208 and 1406 occur simultaneously according to an annealing schedule, and step 1404 occurs according to a second annealing schedule different from the annealing schedule. In another embodiment, steps 1402 and/or 1404 start after a beginning of the annealing schedule, and finish before an end of the annealing schedule.

Figure 15:
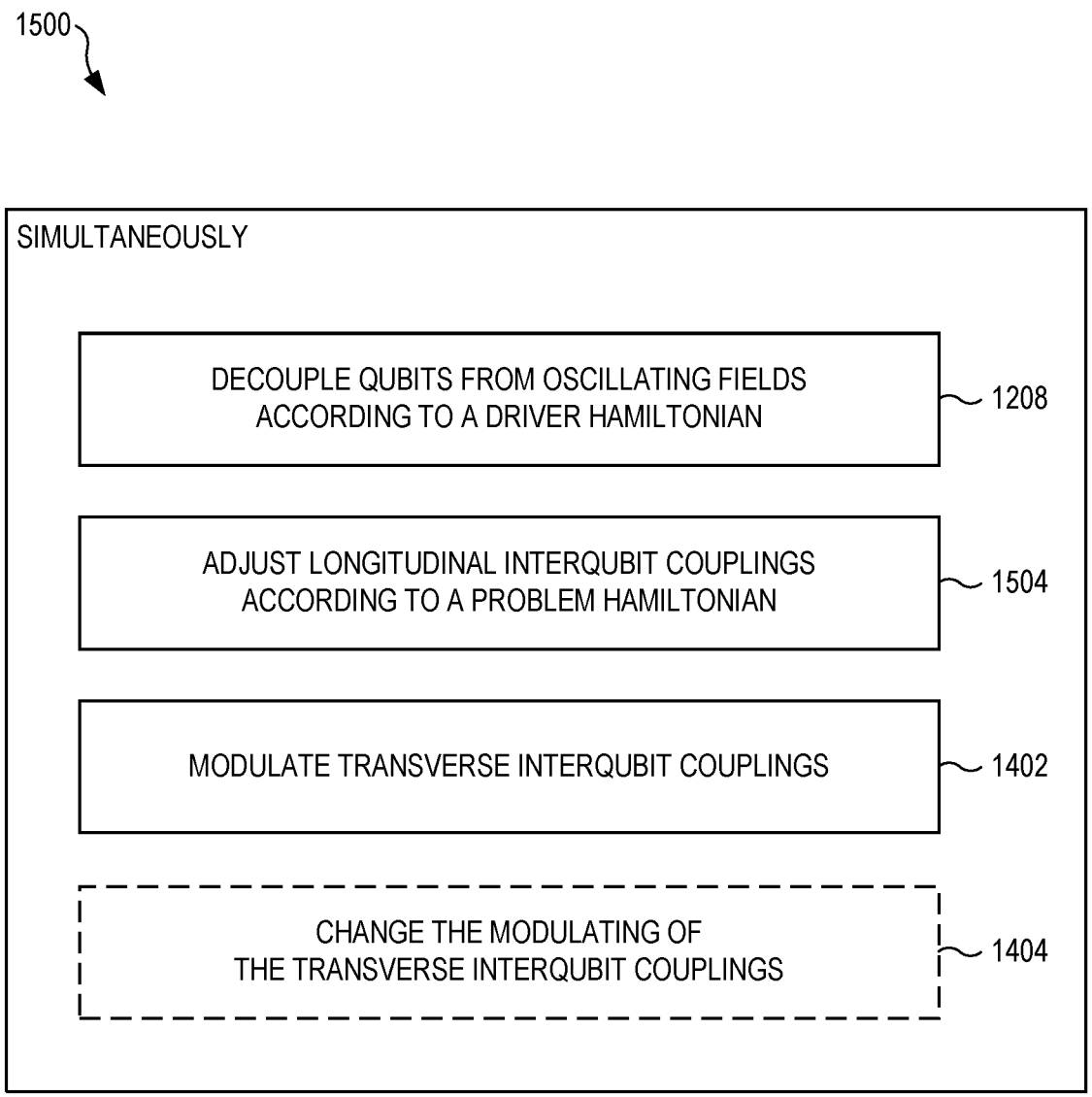
FIG. 15 shows one example of a fourth quantum annealing method, in embodiments.

FIG. 15 shows one example of a quantum annealing method 1500. Method 1500 includes step 1208 of method 1200. Method 1500 also includes a step 1504 of adjusting a plurality of longitudinal interqubit couplings that longitudinally couple the qubits to each other according to a problem Hamiltonian. In one example of step 1504, qubits 102 of FIG. 9 are longitudinally coupled to each other via longitudinal interqubit couplings 906. In another example of step 1504, static flux 630 of FIG. 6 is changed over time according to annealing schedule s(t) so as to increase longitudinal interqubit coupling strength between first and second qubits 600(1), 600(2). Method 1500 also includes step 1402 of method 1400.

In one embodiment, method 1500 includes step 1404 of method 1400. In the example of FIG. 15, steps 1208, 1504, 1402, and 1404 occur simultaneously to implement annealing with an instantaneous Hamiltonian (e.g. Hamiltonian $\hat{H}_I$ of Eqn. 5) according to an annealing schedule (e.g., annealing schedule s(t)). In another embodiment, steps 1208 and 1504 occur simultaneously according to the annealing schedule, and step 1404 occurs according to a second annealing schedule different from the annealing schedule. In another embodiment, steps 1402 and/or 1404 start after a beginning of the annealing schedule, and finish before an end of the annealing schedule.

Figure 16:
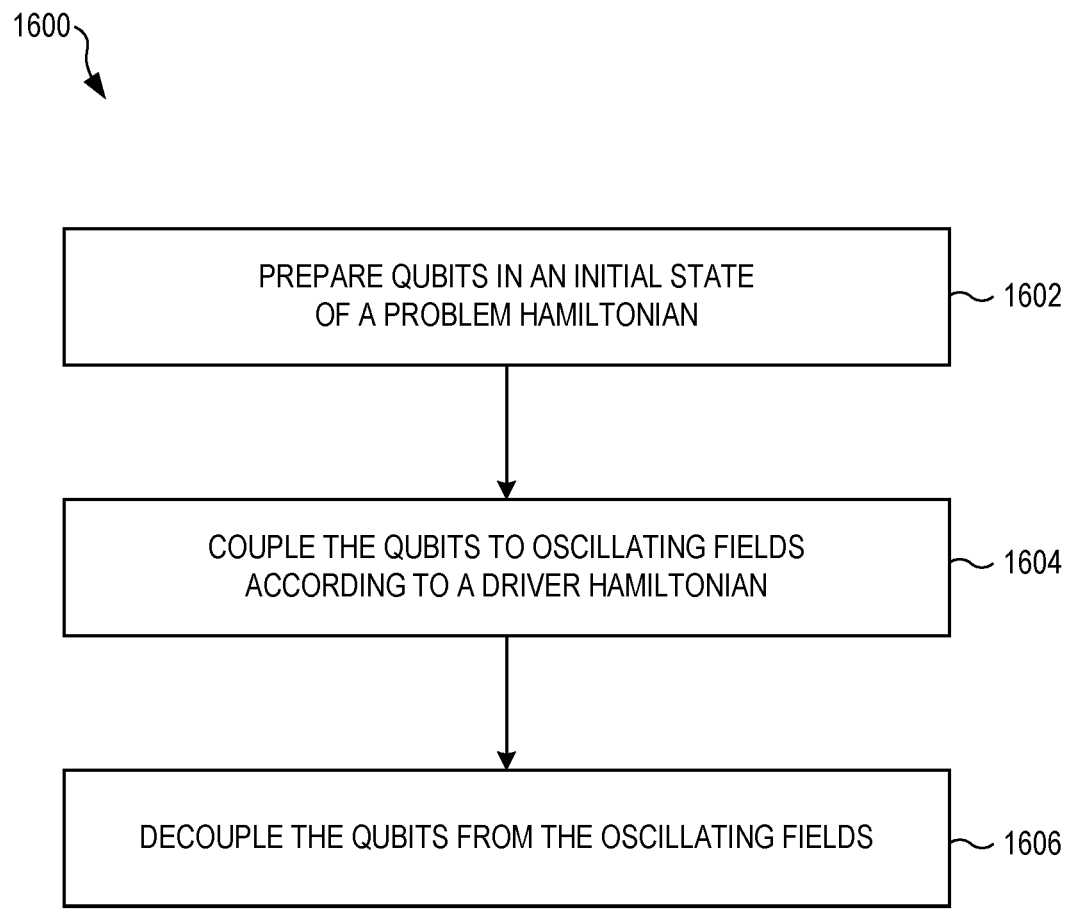
FIG. 16 shows one example of a fifth quantum annealing method, in embodiments.

FIG. 16 shows one example of a quantum annealing method 1600. Method 1600 includes a step 1602 of preparing a plurality of qubits in an initial state of a problem Hamiltonian. Method 1600 also includes a step 1604 of coupling the qubits, after preparing, to oscillating fields that drive the qubits according to a driver Hamiltonian. Method 1600 also includes a step 1606 of decoupling the qubits, after coupling, from the oscillating fields. In one example of steps 1604 and 1606, static magnetic flux 522 of FIG. 5 is changed over time according to annealing schedule 1102 of FIG. 11 so as to first increase coupling of qubit 500 to oscillating field 514 and then decrease coupling of qubit 500 to oscillating field 514, thereby implementing instantaneous Hamiltonian $\hat{H}_I$ of Eqn. 11.

1. Landau-Zener Transitions in Oscillating Fields

To establish that the average rate of mixing in a Landau-Zener-like sweep across $N_F$ oscillating fields is linear in $N_F$, consider the Landau-Zener (LZ) transition from the perspective of Fermi's Golden rule, and consider the minimum gap $\Delta_{min}=2\Omega$ as a perturbation which causes decay from an initial quantum state $|0\rangle$ to a final quantum state $|1\rangle$, with energy transferred into an environment with a Lorentzian density of states peaked about $\epsilon=0$ with a narrow, fictitious width $\Gamma'$ (which can later be taken to zero). Assuming that a z bias $\epsilon$ is swept from $-W/2$ to $+W/2$ in a sweep time $t_f$ quickly enough to linearize the transition probability, and that the linewidth is narrow compared to the range of the energy sweep ($\Gamma' \ll W$), the transition probability $P_1(t_f)$ is given by $$P_1(t_f) \approx \int_0^{t_f} dt |\Omega|^2 \frac{\Gamma'}{\frac{\Gamma'^2}{4} + W^2\left(\frac{t}{t_f} - \frac{1}{2}\right)^2} \quad (13)$$

-continued
$$= \frac{4|\Omega|^2 \tan^{-1}(W/\Gamma')}{W} t_f = 2\pi \frac{|\Omega|^2}{W} t_f.$$

Time-averaging Eqn. 13 yields a mean transition rate $\Gamma_{01}=2\pi|\Omega|^2/W$; exponentiating $\Gamma_{01}$ recovers the Landau-Zener result.

Instead of a simple $H(t)=\epsilon(t)\sigma^z/2+\Omega\sigma^x$ used to derive Eqn. 13, consider a more complex oscillatory driving element $$H(t) = \epsilon(t)\frac{\sigma^z}{2} + \left(2\sum_{i=1}^{N_F} \Omega_i \cos(2\pi f_i t + \phi_i)\right)\sigma^x \quad (14)$$

For a single tone ($N_F=1$), the adiabatic result of Eqn. 13 can be recovered via a rotating-frame transformation. But for larger $N_F$, the same Fermi's Golden rule argument applies, provided that the frequencies $f_i$ are well-separated compared to the amplitudes $\Omega_i$ and that all the frequencies $f_i$ are contained within the energetic range W. Taking into account that the transition rate from $|0\rangle$ to $|1\rangle$ is the same as the transition rate from $|1\rangle$ to $|0\rangle$, and assuming that the system begins in state $|0\rangle$ at t=0, a final excitation probability $P_1(t_f)$ is given by $$P_1(t_f) = 0.5\left(1 - e^{-4\pi\Gamma_T t_f}\right), \quad (15)$$

$$\Gamma_T \equiv \frac{1}{W}\sum_{i=1}^{N_F} |\Omega_i|^2.$$

Eqn. 15 matches Eqn. 13 for short sweep times $t_f$, and is also valid in the limit of large $t_f$, though unlike the adiabatic LZ problem, the long-time asymptotic state is an incoherent mixture of $|0\rangle$ and $|1\rangle$ with equal probability. Tones $f_i$ which do not lie in the energetic range W do not contribute to the transition probability. Thus, the mixing rate between states for a single spin in a slowly-varying z field, subject to $N_F$ weak transverse oscillating fields, scales as the sum of the squared Rabi frequencies of all tones.

Figure 17:
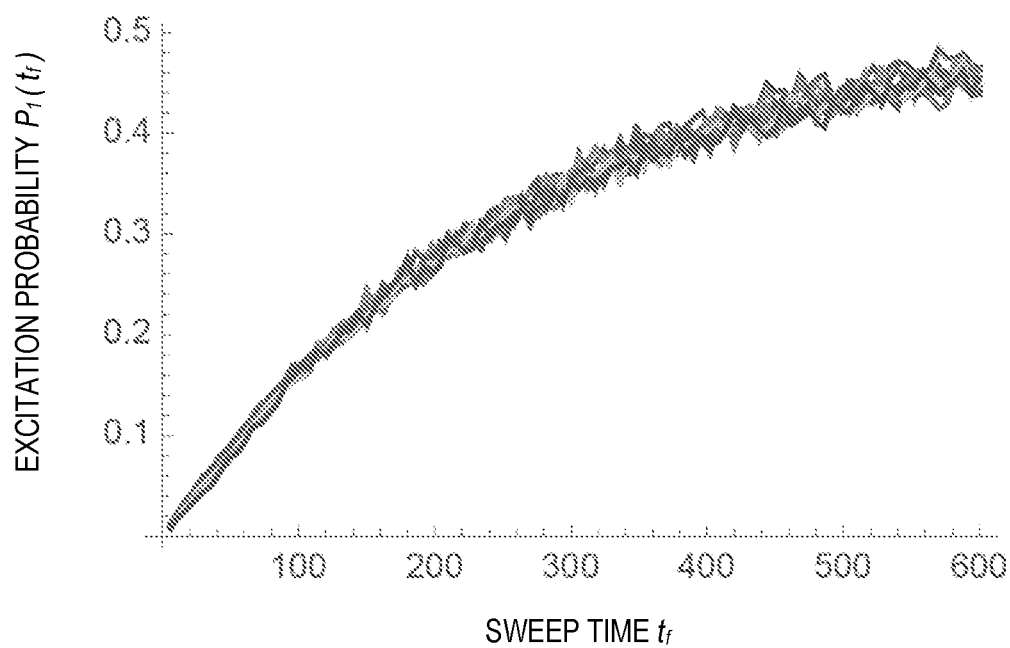
FIG. 17 shows results of a numerical simulation of excitation probability versus sweep time for an oscillating Landau-Zener model, in embodiments.

FIG. 17 shows results of a numerical simulation of excitation probability $P_1(t_f)$ versus sweep time $t_f$ for the oscillating Landau-Zener model described by Eqns. 14 and 15. In FIG. 17, W=1, and each $\Omega_i=\pm 0.01/2^{(k-1)/2}$ for $2^k$ random frequencies with k running from 2 to 10, averaged over 900 random traces per data point. Up to finite-N fluctuations, the curves lie on top of each other, demonstrating that excitation probability $P_1(t_f)$ scales as $P_1(t_f)=0.5(1-\exp(-4\pi N\langle|\Omega_i|^2\rangle/W))$ even in the large-N limit.

Longitudinal noise, in the form of a randomly fluctuating energy difference between the two states, can frustrate the transition and reduce the success probability. First, in the presence of random oscillating terms, even arbitrarily long evolution times will not produce a unit success probability since the noise can induce diabatic transitions between the two states. Consequently, unless the noise amplitude is weak compared to the minimum gap, the maximum success probability will be at most ½, as in the previous case where the transverse field oscillated. Second, the previous treatment can easily account for energetic fluctuations by replacing the fictitious Lorentzian width $\Gamma'$ with the average magnitude $W_r$ of the energetic fluctuations. For $W_r \ll W$, this will have negligible effect (aside from reducing the maximum success probability to ½), but as $W_r$ reaches or exceeds W, the arctan function decreases as $W/W_r$, leading to an overall solution rate $\Gamma_T \propto \Delta_{min}^2/\max\{W,W_r\}$.

In a multi-qubit system, the effect of noise may be worse, as noise which is sufficiently high frequency and/or high amplitude can create local excitations out of the two-state manifold. However, if the noise is low enough in frequency and the local excitation gap (the energy cost to flip a single spin) is constant, then these events are exponentially suppressed and the effect of noise is simply to reduce the solution rate by a factor $1/W_r$, where $W_r \propto N^{1/2}$ for a generic N-qubit system with independent noise sources, depending on the type of transition. This does not change the difficulty exponent of problems where the time to solution increases exponentially in N, again provided that local excitations do not occur.

2. Mechanism for a Quantum Speedup

The addition of oscillating terms dramatically changes the evolution of a quantum annealer, advantageously allowing a solution to be found more quickly than in StoqAQC, at the cost of having a maximum success probability of ½ rather than 1 (even as $t_f \to \infty$). For an N-qubit problem (i.e., MBQS 100 of FIG. 1 with $N_q$ qubits 102 driven by an equal number $N_F$ of oscillating fields 110, such that $N_q = N_F = N$), it might be expected that a reduction in runtime is proportional to N since there are N tones applied to the system. Given that commercial quantum annealing hardware with over two thousand qubits already exist (e.g., D-Wave Systems model 2000Q), even linear scaling with N is significant. However, higher-order processes arising from coherent quantum many-body dynamics lead to more substantial improvements for a broad class of problems.

The basic mechanism for the quantum speedup in embodiments is depicted in FIG. 4. Consider N spins (e.g., qubits 102 of FIG. 1) driven with oscillating fields with N distinct frequencies $f_i$ (e.g., oscillating fields 110 of FIG. 1). For many important problems, the single-spin matrix element between competing ground states |G⟩ and |E⟩ from a $\sigma_i^x$ or $\sigma_i^y$ operation scales identically with N when compared to the minimum gap; this scaling is proved below for the Grover problem and tunneling between bit-string state minima. It is believed that this scaling is a generic feature of first-order quantum phase transitions that, when combined with the arguments of the previous section (i.e., Section 1.), suggests a factor of 2N=C (where C is a problem- and amplitude-dependent constant) improvement in the time to solution compared to constant-schedule StoqAQC; the factor of 2 comes from both positive frequencies acting before the avoided crossing and negative frequencies acting after it.

Now consider the effect of two spins driven in combination at frequencies $f_1$ and $f_2$, and let the energy $\omega_G - \omega_E$ cross $f_1 + f_2$. In generic problems there will be a resonant process where the ground state |G⟩ absorbs two photons from the oscillating spins to mix with |E⟩, and a simple examination of perturbative corrections suggests that the scaling with N of the Rabi frequency $\Omega_{12}$ should be identical to that of $\Omega_1$, albeit with a reduced prefactor as it arises at second order in the drive amplitudes $\alpha_i$. However, there are $$2^2 \binom{N}{2}$$

such terms, so at large N this contribution will dominate the linear order term. This analysis can be extended to combinations of m tones, of which there are $$2^m \binom{N}{m}$$

distinct combinations, all of which will contribute to the transition rate $\Gamma_T$ in Eqn. 15. Thus, N-spin driving produces an exponential number of distinct driven transitions (of which only some are sketched in FIG. 4), all of which can accelerate transitions in hard optimization problems relative to constant-schedule StoqAQC. Further, as described in more detail below, the resulting potential disorder that may arise from randomly varying the transverse field is at most linear in N, and given suitably random distributions of the drive fields, it can be approximated as a simple line broadening $W_r$ as argued above, and will not significantly increase the time to solution compared to the exponential reduction from the resonant combinations.

For embodiments herein to achieve a meaningful speedup boost over StoqAQC, the problem of interest must satisfy a few general properties. First, the local excitation gap $\Delta_{local}$, or the energy cost to create an excitation through a single spin operation, should be finite across the entire annealing cycle: ideally O(1), though inverse polynomial may be acceptable in comparison to an exponentially decreasing minimum gap. This is not a formal requirement for StoqAQC, though it can be for practical analog implementations, since the system is unavoidably coupled to a low-temperature bath and thermal excitations will rapidly push the system away from the ground state unless temperature T is small compared to the local gap at all times. It also implies that embodiments herein may fail at second-order transitions where both the minimum gap and local excitation gap close as N increases (the details of a given transition may depend on boundary conditions and other factors). Finally, near the transition where the gap $\Delta_{local}$ is small but finite, the matrix elements between the crossing states |G⟩ and |E⟩ from combinations of $m\sigma_i^x$ or $\sigma_i^y$ operators (with m running from 1 to N) must decline with N no more quickly than $\Delta_{min}$ itself. For both problem classes considered in this work, the scaling of the matrix elements and $\Delta_{min}$ is identical, and indeed, there is no known problem where the N-scaling of the two quantities significantly differs. However, such models may be possible, and if the few-spin matrix elements decay to zero much more quickly than $\Delta_{min}$, embodiments herein may not be effective.

Mitigating Heating

With regards to oscillating fields 110 heating MBQS 100, off-resonant heating, where diabatic transitions induced by the drive fields create physical local excitations (as opposed to virtual excitations that contribute to perturbative multi-spin resonances), is indeed a concern for embodiments herein as excitations out of the two-level manifold can potentially place the MBQS 100 in a many-excitation continuum, driving it far from the ground state. If MBQS 100 is driven into higher excited bands, the probability of returning to the true ground state could become negligible; thus, care must be taken to keep this from occurring.

One option is to compensate off-resonant heating with a cold bath, though the resulting incoherent tunnelings may interfere with the coherent many-body transitions induced by the drive fields and degrade performance A better solution is to lower the frequencies with increasing N. For example, assume that the runtime in absence of such unwanted excitations scales as $e^{cN}$, and let $\omega = \omega_0/N^{1+\delta}$, where $\delta$ is a small positive number. To see why this is sufficient to prevent off-resonant heating, consider driving a single spin over a single oscillatory cycle, a system whose evolution can be modeled as a Landau-Zener tunneling model with a "velocity" $v=\alpha\kappa\omega/k$ parametrizing the rate of evolution between the states at $t=0$ and $t=\pi/\omega$. Here, k is a proportionality constant dependent on the details of the model and driving protocol; with this form, the "distance" in Hamiltonian parameter space is proportional to the product of the transverse field strength and oscillation amplitude, traversed at a rate proportional to $\omega$. Also included in the Landau-Zener model is a "transverse field" $\Delta_{local}$ equal to the energy difference between the many-body ground state and the local excitation created by a diabatic transition, assumed to be O(1). The mean transition probability of creating a local excitation in a single cycle $P_E$ can be found from the Landau-Zener formula, and scales as:

$$P_E \propto e^{-\frac{k\Delta_{local}^2}{\alpha\kappa\omega}} = e^{-E_0 N^{1+\delta}}. \qquad (16)$$

From Eqn. 16, the error probability per cycle decays exponentially in $k\Delta_{local}^2/(\alpha\kappa\omega)$, and thus, to avoid off-resonant heating in a single cycle, the magnitude or direction of the transverse field must be altered adiabatically compared to $1/\Delta_{local}$, and not $1/\Delta_{min}$, the true many-body energy gap at the avoided crossing. In this adiabatic regime, the per-cycle error rate will decay exponentially with polynomial decreases in $\omega$.

There are a total of $e^{cN}/N^{1+\delta}$ cycles in the evolution, and N spins being driven, so the probability of not creating a diabatic error at any time in the evolution is approximately $$P_{NE} \approx (1-NP_E)^{e^{cN}/N^{1+\delta}} \approx 1 - \frac{e^{cN-dN^{1+\delta}}}{N^\delta}. \qquad (17)$$

The error rate thus vanishes as $N \to \infty$; if the problem runtime is given by a stretched exponential $e^{cN^\gamma}$ then let $\omega = \omega_0/N^{\gamma+\delta}$. This analysis assumes that the average local excitation gap $\Delta_{local}$ is constant at large N; frequency can be reduced even more quickly to compensate for this so long as $\Delta_{local}$ is at least inverse polynomial in N.

Of course, a physical implementation of the oscillating fields may introduce secondary heating concerns not captured in the spin model of driver and problem Hamiltonians. For example, oscillating electromagnetic fields in a flux qubit implementation can heat the environment around the qubits themselves, increasing thermal noise and unwanted excitations. However, at the level of the spin Hamiltonian, potential off-resonant heating issues can be easily addressed in embodiments herein by polynomially decreasing the frequencies of the applied tones as the problem size increases.

3. The Grover Problem

To demonstrate the power of oscillating fields in quantum annealing, consider driver Hamiltonian $H_D$ applied to the Grover problem. In the AQC context, the Grover oracle Hamiltonian is a projector onto a single (unknown) bit string $|G\rangle$, with $$H_G = -\frac{N}{2}|G\rangle\langle E|. \qquad (18)$$

Let $\kappa = \frac{1}{2}$, choose the annealing schedule to be $H(t)=(1-s(t))H_0+s(t)H_G$ and let $|0\rangle$ be the paramagnetic ground state of $H_0$. To diagonalize the system, select $H_0 = -(\Sigma_{i=1}^N \sigma_i^x)/2$, which will be replaced with $H_D$ (see Eqn. 1) later. The problem difficulty is controlled by a single first-order paramagnet-to-spin-glass transition at $s_c=0.5+O(1/N)$. The minimum classical number of queries to solve this problem is $O(2^N)$, and the optimality of Grover's algorithm ensures that quantum methods, as formulated herein, cannot solve it in less than $O(2^{N/2}/N)$ time. This square-root speedup can be arrived at through adiabatically annealing with a variable-rate schedule, or by diabatically jumping to the transition point $s_c$ and waiting a time $T \propto \Delta_{min}^{-1} \propto 2^{N/2}/N$ for the states to be mixed; in contrast, naive evolution at a constant rate requires $T \propto \Delta_{min}^{-2} \propto 2^N/N$, eliminating the quantum speedup. Explicitly, $$\Delta_{min} \approx (1-s_c)N2^{-N/2}, \qquad (19)$$

where $s_c \approx \frac{1}{2}$; this prediction will be derived below. The diabatic jump speedup can be recovered in embodiments by halting the evolution at some s near the transition $s_c$ where the energy gap is known exactly, and driving the system at that precisely that frequency.

However, both variable-rate annealing and diabatic jumps require a detailed knowledge of the energy spectrum to exponential precision, something that is extremely difficult in more general problems and impossible in current analog quantum hardware, where 1/f noise causes constant random drift in the energy of competing ground states. So in applying driver Hamiltonian $H_D$ of Eqn. 1 to the Grover oracle, it will suffice to compare the performance of constant annealing schedules, with and without oscillating fields. Though it has no realistic analog implementation, this model is studied because of its simplicity and its empirical value, as it is the simplest case of a larger class of scrambled cost function and random energy models, which are computationally hard quantum spin glasses. Many problems with a first-order paramagnet-to-spin-glass transition are phenomenologically similar to the Grover problem, so general methods for speeding up the time to solution in Grover should be widely applicable.

The simplicity of the problem Hamiltonian allows the scaling of matrix elements to be predicted analytically, though due to the paramagnetic structure the analysis is more complex than in the original formulation of this problem, where $H_0$ was a simple projector onto the paramagnetic ground state and did not have local spin structure. To find an analytic solution, consider a basis consisting of the Grover state $|G\rangle$ and all the paramagnetic states with fewer than $N^* < N$ local excitations; the choice of sufficiently large $N^*$ is arbitrary as higher energy states have increasingly small contributions to the low-energy physics (see below), and it is chosen to avoid concerns about working in an overcomplete basis. Hereinbelow, all calculations will be performed to leading order in $2^{-N/2}$, and all terms which decay as $2^{-N}$ will be dropped. Let $|0\rangle$ be the paramagnetic ground state, and denote the excited states by $|i\rangle \equiv \sigma_i^z |0\rangle$, $|ij\rangle \equiv \sigma_i^z \sigma_j^z |0\rangle$, $|ijk\rangle \equiv \sigma_i^z \sigma_j^z \sigma_k^z |0\rangle$, and so on. The set of states $\{|G\rangle, |0\rangle, |i\rangle, |ij\rangle, \ldots\}$ will first be orthogonalized through a Gram-Schmidt process. Under this mapping, $$|G\rangle \to |G\rangle, \qquad (20)$$
$$|0\rangle \to |0\rangle - \frac{1}{2^{N/2}}|G\rangle,$$

-continued $$|i\rangle \to |i\rangle - \frac{c_i}{2^{N/2}}|G\rangle + O(2^{-N}),$$

$$|ij\rangle \to |ij\rangle - \frac{c_i c_j}{2^{N/2}}|G\rangle + O(2^{-N})$$

where $c_i \equiv -\langle G|\sigma_i^z|G\rangle = \pm 1$. In this new basis, all states are orthogonal.

The next step is to diagonalize $H(s) = (1-s)H_0 + sH_P$. Note that in the absence of mixing between $|G\rangle$ and the paramagnetic states, $$E_0 \approx -(1-s)\frac{N}{2}, E_G \approx -s\frac{N}{2} - \frac{(1-s)^2}{2}. \quad (21)$$

Furthermore, $$\langle G|H_0|G\rangle = -\frac{N}{2^{N/2+1}}, \langle G|H_0|i\rangle = -\frac{(N-2)c_i}{2^{N/2+1}},$$

$$\langle G|H_0|ij\rangle = -\frac{(N-4)c_i c_j}{2^{N/2+1}}, \dots$$

$$\langle 0|H_0|0\rangle = -\frac{N}{2} + 0(2^{-N}),$$

$$\langle i|H_0|i\rangle = -\frac{N-2}{2} + 0(2^{-N}), \dots$$

$$\langle i|H_0|0\rangle = \langle i|H_0|j\rangle = \langle ij|H_0|k\rangle \dots = O(2^{-N}),$$

$$\langle i|H_P|0\rangle = \langle i|H_P|j\rangle = \langle ij|H_P|k\rangle \dots = O(2^{-N}),$$

$$\langle G|H_P|0\rangle = \langle G|H_P|i\rangle = \langle G|H_0|ij\rangle \dots = 0.$$

With these relations in hand, $H(s)$ can be diagonalized and matrix elements predicted. Of particular interest is the limit where $E_0-E_G$ is polynomially, but not exponentially, small in N, e.g., when s is near the transition at $s_c=\frac{1}{2}+O(1/N)$. Working to leading order in $2^{-N/2}$, new basis states may be expressed $$|0'\rangle = |0\rangle + \frac{1}{2^{N/2}}\frac{(1-s)N}{2(E_0-E_G)}|G\rangle, \quad (22)$$

$$|i'\rangle = |i\rangle + \frac{1}{2^{N/2}}\frac{(1-s)(N-2)c_i}{2(E_0+(1-s)-E_G)}|G\rangle,$$

$$|ij'\rangle = |ij\rangle + \frac{1}{2^{N/2}}\frac{(1-s)(N-4)c_i c_j}{2(E_0+2(1-s)-E_G)}|G\rangle,$$

$$|G'\rangle = |G\rangle - \frac{1}{2^{N/2}}\left(\frac{(1-s)N}{2(E_0-E_G)}\right)|0\rangle -$$

$$\frac{1}{2^{N/2}}\sum_{i=1}^{N}\frac{(1-s)(N-2)c_i}{2(E_0+(1-s)-E_G)}|i\rangle -$$

$$\frac{1}{2^{N/2}}\sum_{i<j}^{N}\frac{(1-s)(N-4)c_i c_j}{2(E_0+2(1-s)-E_G)}|ij\rangle + \dots$$

These expressions neglect corrections which scale as $2^{-N}$. From the corrections to $|0\rangle$ and $|G\rangle$, the minimum gap can be obtained: $\Delta_{min} \equiv 2\Omega_0 = (1-s_c)N2^{-N/2}$.

Next, resonant matrix elements for the mixing of $|0'\rangle$ and $|G'\rangle$ through the oscillating y fields will be computed. First consider the transition rate $\Omega_1$ for the mixing of $|0'\rangle$ and $|G'\rangle$ through an oscillating field Hamiltonian driving a single spin as $$\alpha\frac{1-2}{2}\sigma_i^y \sin(2\pi f_i t).$$

From Eqn. 22, with $f_i = E_G - E_0$, the driving amplitude $\Omega_1$ is $$\Omega_1 \approx \pm\frac{1-s}{4}\langle G'|\sigma_i^y|0'\rangle \approx \quad (23)$$

$$\frac{(1-s)^2(N-2)2^{-\frac{N}{2}}}{8(E_0+(1-s)-E_G)} \approx \frac{\alpha}{4}\frac{(1-s_c)(N-2)2^{-\frac{N}{2}}}{2}.$$

Taking the limits of $(E_G-E_0) \to 0$ and $s \to s_c$ yields the rate at the far-right of Eqn. 23. These limits are taken as it is expected that the drive frequencies inducing these transitions decrease polynomially with N (remaining large compared to $\Delta_{min}$, which decays exponentially), for reasons explained below. The denominator thus reduces to powers of $(1-s)$, which is constant as N increases.

Now consider driving two spins at amplitudes $\alpha$ and frequencies $f_1$ and $f_2$. If $|f_1 \pm f_2| \approx E_G - E_0$, the system will be resonantly driven between $|0'\rangle$ and $|G'\rangle$ through a two-spin process, where one spin absorbs an off-resonant photon, virtually exciting it into the $|i\rangle$ manifold, and the second spin then absorbs a second photon, promoting it to $|G'\rangle$ through the component of $|G'\rangle$ along $|ij'\rangle$. Noting that combinatorics will provide a factor of two increase (from the order in which photons are absorbed), $$\Omega_2 \approx \frac{\alpha^2(1-s)^3(N-4)2^{-\frac{N}{2}}}{8(1-s-f_{1/2})(E_0+2(1-s)-E_G)} \approx \left(\frac{\alpha}{4}\right)^2\frac{(1-s_c)(N-4)2^{-\frac{N}{2}}}{2}. \quad (24)$$

Again, the rate at the far-right of Eqn. 24 is in the limits $(E_G-E_0) \to 0$ and $s \to s_c$.

These results may be extended to three spins, driven at frequencies $f_{1/2/3}$. The same arguments yield $$\Omega_3 \approx \left(\frac{\alpha}{4}\right)^3\frac{(1-s_c)(N-6)2^{-\frac{N}{2}}}{2}, \quad (25)$$

as the factor of 6 from combinatorics balances the denominator of $6(1-s)^3$. Extending this result to m spins yields $$\Omega_m \approx \left(\frac{\alpha(1-2)}{4}\right)^m \frac{m(1-s)(N-2m)2^{-\frac{N}{2}+1}}{(1-s)^{m-1}(E_0+m(1-s)-E_G)} \quad (26)$$

$$\approx \frac{\alpha^m}{4^m}(1-s_c)(N-2m)2^{-\frac{N}{2}-1}$$

Figure 18:
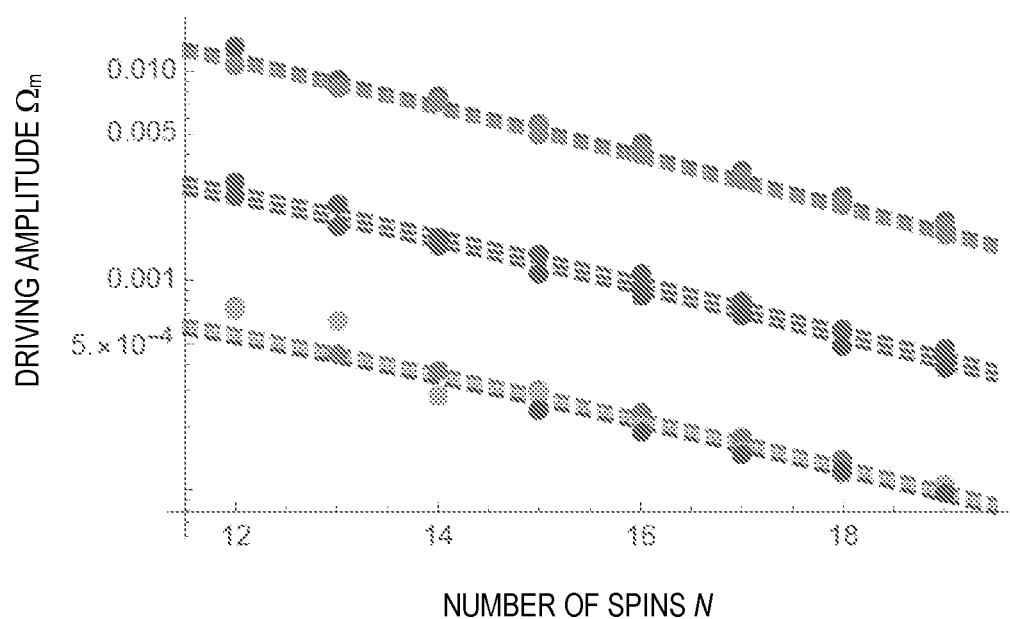
FIG. 18 shows numerically-estimated matrix elements for coherent m-spin driving in the Grover problem, in embodiments.

FIG. 18 shows numerically-estimated matrix elements for coherent m-spin driving in the Grover problem. FIG. 18 plots the analytical predictions of $\Omega_m$ from Eqns. 23-26 (curves) up to m=3, for N running from 12 to 18, alongside numerically estimated values of m (points) with bare amplitude $\bar{\alpha}=1$ (corresponding to an effective driving amplitude of 0.88). For the numerically-estimated matrix elements, $E_G-E_0 = \{0.125, 0.1, 0.075\}$. The value of m was found in each case by numerically integrating the time-dependent Schrodinger equation for fixed s with one, two, or three spins driven; for two- and three-spin driving each point is averaged over three choices of the $f_i$ summing to $(E_G-E_0)$. The system was initialized in the true ground state $|\psi(0)\rangle = |0'\rangle$ (computed with exact diagonalization) at $t=0$. The oscillating fields were then turned on, creating Rabi oscillations between $|0'\rangle$ and $|G'\rangle$; $|\langle G'|\psi(t)\rangle|^2$ was tracked and $\Omega_m$ estimated from the mean of the time to the peak value expectation value and half the time to return to the ground state. Note that the theoretical predictions shown in FIG. 18 include corrections for finite $E_G-E_0$, as described above.

Optimal Drive Amplitudes and Large-N Scaling

Returning to the Grover problem, the contributions of all the terms at each order which will contribute to the multi-frequency LZ prediction of Eqn. 15 may be summed. At zeroth order, the minimum gap may be found, with $\Omega_0 \approx (1-s_c)N2^{-N/2}/2 = \Delta_{min}/2$. At first order there are 2N contributions, N from positive frequencies ahead of the transition and N from negative frequencies after the minimum gap has been crossed. At second order, there are $$2^2 \binom{N}{2}$$

independent terms, as each contribution of two frequencies (positive or negative) drives an independent transition between the two states. At third order, there are $$2^3 \binom{N}{3}$$

terms, and so on, summing all contributions as in Eqn. 15 results in a total transition rate of $$\Gamma_T \approx \frac{(1-s_c)^2 N^2}{2^N W} \sum_{n=0}^{N} \left(\frac{\alpha_m^2}{8}\right)^n \left(1-\frac{2n}{N}\right)^2 \binom{N}{n} \quad (27)$$

$$\approx \frac{N}{4} \frac{\alpha_m^2/2N + (1-\alpha_m^2/8)^2}{(1+\alpha_m^2/8)^2} e^{-\left(\log 2 \frac{\alpha_m^2}{8}\right)N}.$$

In the last step it was assumed that $W \approx N$ and $s_c \approx \frac{1}{2}$. Plugging in $\alpha = \alpha_m$, as discussed above with respect to Eqn. 9, results in an average time to solution of $2^{0.747N}$, which is worse than the optimal runtime of $2^{N/2}$ achievable by variable rate annealing. Nonetheless, it still represents a quantum speedup, and one which requires no detailed knowledge of the instantaneous gap. Based on the arguments earlier in this work, it will thus be at least somewhat resilient to energy fluctuations from 1/f noise. While the Grover oracle is not a realistic model for analog quantum annealing, these results suggest that embodiments herein can provide a useful speedup near paramagnet-to-spin-glass transitions as well.

Details and Analysis

Before moving on to bit-string state transitions, it is worth making three further points of interest here. First, for both the Grover problem (see Eqn. 23) and the spin-glass transition, the scaling of the site-averaged single-spin matrix element $\langle \tilde{\Omega} \rangle \equiv \langle\langle E|\sigma_i^{x/y}|G\rangle\rangle_i$ with N near the transition (where the gap is small but large compared to $\Delta_{min}$) is identical to the scaling of the minimum gap itself. It is conjectured that this behavior is generic near first-order transitions in relevant problems. In cases where this conjecture holds, this suggests that, at large enough N, even with no oscillating fields, constant-schedule annealing with a cold bath has greater computational power than constant schedule annealing in a closed system, by a factor of $N(g/\kappa)^2$, where g is the system-bath coupling strength. However, because the cold bath does not induce coherent multi-spin transitions the way that a combination of oscillating tones can, these predictions suggest it cannot reduce the difficulty exponent of the problem through relaxation processes alone.

Second, embodiments utilizing Eqn. 2 for the driver Hamiltonian (i.e., amplitude oscillations in the transverse field) may fail to produce a quantum speedup for the Grover problem because locally varying the magnitude of a $\sigma_i^x$ field cannot create an excitation (real or virtual) in the paramagnet Hamiltonian (this is true up to irrelevant corrections that scale as $2^{-N}$ when the Grover Hamiltonian is included). Consequently, there is no mechanism to resonantly combine tones beyond first order, and the exponential proliferation of tone combinations depicted in FIG. 4 will not occur. However, it will be shown in Section 3 below that embodiments utilizing Eqn. 1 as the driver Hamiltonian fail for transitions between bit string states, indicating that neither scheme is a "black box" that accelerates all first-order phase transitions in adiabatic quantum computing.

Finally, there is a constraint that the $f_i$ must be small enough to avoid populating off-resonant single-spin excitations, detailed in the previous section concerning mitigating heating. When compared to the modest single-spin excitation energy ($\Delta_{local} \approx 0.5$ near $s_c$), $\Delta_{min}$ only becomes dramatically smaller at fairly large N; even for N=14, $\Delta_{local}/\Delta_{min} < 10$. This means that larger N must be considered, so as to be in a regime where off-resonant excitations do not erase any performance advantage, and at such large N the exponential cost of directly integrating the Schrodinger equation, for long times and with enough random samples to obtain good statistics, is significant. Likewise, the runtimes must be relatively long since the drive tones must be adequately sampled, which is impossible unless $t_f$ is large compared to $1/f_i$.

An Alternative Protocol for Solving the Grover Problem with Embodiments

To overcome some of the shortcomings listed above, presented here is an alternative protocol for demonstrating a quantum speedup in the Grover problem. In comparison to constant-schedule StoqAQC, this alternative protocol has a runtime which is longer by an N-independent prefactor; this longer runtime allows better sampling of low-frequency drive tones (reducing heating issues), in return displaying superior N-scaling when oscillating fields are introduced, at small enough N to be amenable to classical simulation. The method works as follows:

(i) Initialize the system in the paramagnetic ground state of $\hat{H}_I(0) = -\Sigma_{i=1}^N \sigma_x^{(i)}$.

(ii) Pick a value of $s \in \{s_{min}, s_{max}\}$, where $s_{min}$ and $s_{max}$ define an N-independent range that includes the transition point $s_c$. Choose a random s, as the location of the transition $s_c$ may not be known a priori, and in any realistic analog implementation it would be obscured by random longitudinal noise. Choosing $s_c$ exactly in noise-free evolution recovers the full Grover speedup. Instantaneously jump to this point, that is, begin evolving the system under instantaneous Hamiltonian $\hat{H}_I(s(t))$ of Eqn. 5.

(iii) Wait a time $t_f = C/\Delta_{min}$, where C is some O(1) constant, and then measure the state. The probability of finding the system in the solution state $|G\rangle$ depends on the energy difference $\epsilon$ between $|G\rangle$ and $|0\rangle$, with $$P(\epsilon) \approx \frac{\Delta_{min}^2}{2\epsilon^2} \left(1 + \frac{\Delta_{min}^2}{\epsilon^2}\right).$$

Averaging this over the energetic range W produces $\langle P \rangle \propto \Delta_{min}/W$, and since a time $C/\Delta_{min}$ must pass for each guess, the total runtime of the algorithm scales as $W/\Delta_{min}^2$. If the range $\{s_{min}, s_{max}\}$ has constant width then $W \propto N$ and the time to solution scales as $2^N/N$, identical to StoqAQC up to a constant prefactor.

When steps (ii) and (iii) are modified to to include the oscillating fields of Eqn. 1 (e.g., oscillating fields 110 of FIG. 1), an exponentially growing number of distinct transitions contribute to $P(\epsilon)$, so that the probability of finding the solution is increased relative to evolving under a static Hamiltonian. A similar analysis to that of the previous subsection shows that $P(\epsilon)$, is enhanced by the same factor as in Eqn. 27, and consequently this method may demonstrate a similar speedup as that derived for constant-schedule annealing.

Figure 19:
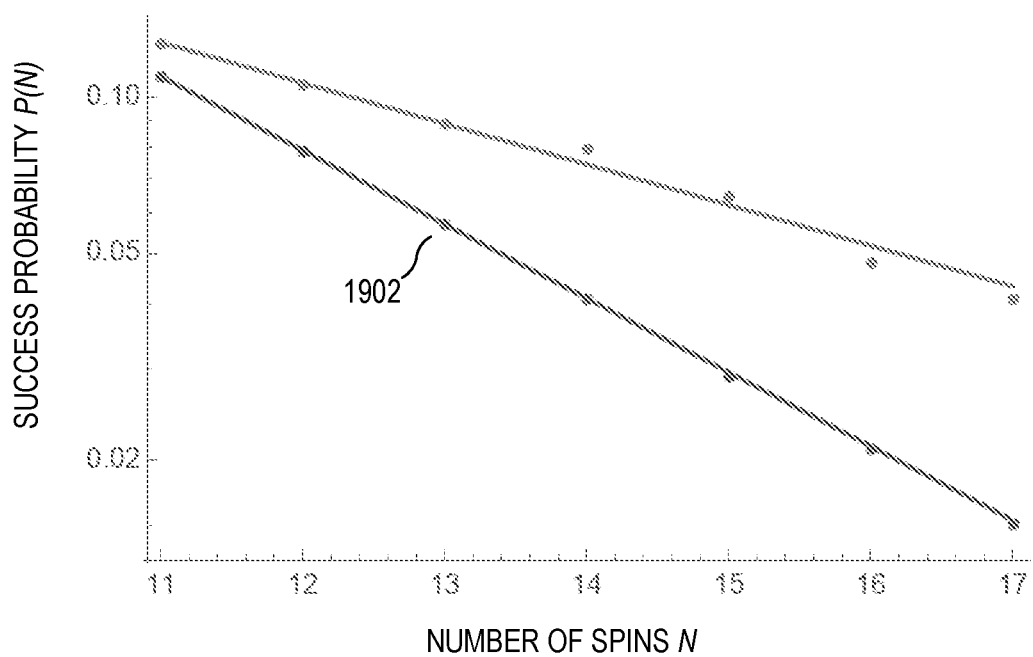
FIG. 19 a plot of success probability versus number of spins for an alternative protocol applied to the Grover problem, in embodiments.

FIG. 19 is a plot of success probability P(N) versus number of spins N for the alternative protocol applied to the Grover problem. For N running from 11 to 17, the system was initialized in the paramagnetic ground state, and a random s was selected from a range $\{0.38, 0.58\}$ chosen to be roughly symmetric about $s_c \approx 0.48$. A first evolution was simulated under a fixed $H(s) = (1-s)H_0 + sH_P$ (i.e., where the driver Hamiltonian is paramagnet Hamiltonian $H_0$ with no oscillating fields). A second evolution was simulated, according to embodiments herein, by utilizing driver Hamiltonian $\hat{H}_D$ of Eqn. 1. For the second evolution, each spin oscillated with bare amplitude $\overline{\alpha} = \pm \alpha_m$ and $f_i$ was chosen randomly from the range $\{1.2/N, 2.16/N\}$. For both evolutions, the system was evolved until $t_f = 2.16/\Delta_{min}$, and the fields were ramped up in amplitude from t=0 with a hyperbolic tangent profile to reduce the number of off-resonant excitations generated by driving. The state was then measured. The average success probability was found numerically with 800 random s values (and frequency combinations for the second evolution) per data point. The Grover state was found with success probability P(N), so the total runtime scales as $t_f/P(N)$. For the Grover problem, the time to solution for this protocol is identical to that of constant-schedule annealing, up to a constant prefactor.

In FIG. 19, a bottom data set 1902 shows evolution under the simple paramagnet Hamiltonian $H_0$ and is best fit by $P(N) \propto 2^{-0.48N}$, close to the asymptotic expected value $2^{-N/2}$. In contrast, a top data set 1904 shows evolution under embodiments here (utilizing driver Hamiltonian $\hat{H}_D(t)$ of Eqn. 1) at constant s for the same runtime; in this case numerically fitted to $P(N) \propto 2^{-0.26N}$, leading to a time to solution of $2^{0.76N}/N$, close to the analytical prediction of $2^{0.747N}/N$ for constant-schedule annealing. Combined with the analytical predictions, FIG. 19 strongly indicates that embodiments herein may realize a quantum speedup for the Grover problem.

4. Bit String Transitions

Consider a quantum spin glass with Hamiltonian $$\hat{H}_{SG} \approx \sum_{i<j} J_{ij} \sigma_i^z \sigma_j^z + \sum_i \beta_i \sigma_i^z. \tag{28}$$

Here, the $J_{ij}$ couple every pair of qubits, with an overall strength that scales as 1/N. In the limit of all $\beta_i \to 0$, and in the presence of a transverse field of strength $\kappa$, with $\kappa$ small enough that the system is in the spin-glass phase, the system will have a spectrum comprised of pairs of states with all N spins flipped along z, with exponentially small splittings due to the $\kappa$ terms. When $\kappa=0$, finding the ground state of the most general case of this problem (without restrictions on connectivity or the distribution of $J_{ij}$ and $\beta_i$) is classically NP-hard.

A key bottleneck mechanism in finding the ground state of these models with AQC is that deep within the spin-glass phase at sufficiently large N, additional avoided crossings between spin glass minima are expected (which are fixed configurations in the z basis, up to small transverse field corrections) as $\kappa$ is reduced to zero. Deep in the spin-glass phase, the low-lying eigenstates of the system are nearly classical, accurately described by a single z-spin configuration with small corrections due to the transverse field. These states are referred to herein as "bit-string" states due to their semiclassical nature. It is important to note however that the higher-order corrections are not ignorable, as they create avoided crossings that allow for quantum tunneling between states.

An intuitive mechanism for such crossings can be derived in second order perturbation theory, though they arise non-perturbatively as well. Imagine that when $\kappa=0$, there is a local minimum state $|E\rangle$ which is separated from the true ground state $|G\rangle$ by M spin flips, with an O(1) energy difference between the states. When turning on a finite transverse field $\kappa$, the energies of $|G\rangle$ and $|E\rangle$ will be modified by $$\Delta E_{G/E} \approx -\kappa^2 \sum_{i=1}^N \frac{1}{\delta_{iG/E}}, \tag{29}$$

$$\delta_{i\psi} \equiv \langle \psi | \sigma_i^x \hat{H}_{SG} \sigma_i^x | \psi \rangle - \langle \psi | \hat{H}_{SG} | \psi \rangle.$$

Generically $\delta_{iG} \neq \delta_{iE}$ (though the difference is expected to be small), so if the energy difference between $|G\rangle$ and $|E\rangle$ is small enough, the transverse field $\kappa$ can push the energy of $|G\rangle$ above that of $|E\rangle$, leading to an M-spin tunneling event between $|G\rangle$ and $|E\rangle$ at some critical $\kappa_C$. This is a first-order quantum phase transition that should have a gap exponentially small in M in general cases, and thus can act as a bottleneck even when the earlier paramagnet-to-spin-glass transition is second-order and has a much larger gap. Given that a "clustering" phase, where the system supports many ground states and near-ground state local minima, separated from each other by an extensive number of spin flips, is phenomenologically observed in fully connected NP-complete problems, this bottleneck may occur in a wide range of practical problems.

Since these transitions only occur in the large-N limit, it is not possible to simulate their full quantum dynamics on a classical computer. To study the effect of embodiments herein on such transitions, consider a simplified picture of N-spin tunneling. Assume that the annealing protocol begins in one of the two ground state minima at constant $\kappa$, with the $\beta$ terms small but not equal to zero, and then slowly ramps the $\beta$ values to opposite signs so that the system ends in the other minimum through an N-spin tunneling process if the ramp is sufficiently slow. This phenomenologically approximates the influence of the varying $\delta_{iG/E}$ in Eqn. 29. For simplicity, it will be assumed all the terms are aligned along the direction of one minimum, thus ensuring that there is no competition with other states during the ramp.

Ground-State Energy Gap

To illustrate the mechanism by which embodiments herein utilizing Eqn. 1 for the driver Hamiltonian speeds up transitions between nearly classical ground states, the minimum energy gap must first be found, and to do so, it suffices to compute the N-spin tunneling matrix element. Let $\{|n\rangle\}$ be the set of states which differ from the ground state by n spin flips. For simplicity, assume that there are no low-energy sequences of spin flips between states, or if there are, that combinatorial advantage of summing over all possible sequences dominates them. Define $$\epsilon_n \equiv \langle\langle n|\hat{H}_{SG}|n\rangle\rangle_n - \langle G|\hat{H}_{SG}|G\rangle; \chi_P \equiv \prod_{m=1}^{P} \epsilon_m. \tag{30}$$

Here the average in $\epsilon_n$ is taken over all states which are n spin-flips away from the minimum, and it is expected that $\epsilon_n$ is peaked around m=N/2 and is roughly symmetric about that point. Formally, the minimum gap is a sum over all sequences of spin-flips which join the two minima, which contains N! terms and is thus generally prohibitive to compute in practice. However, under the assumption above that there are no low-energy paths, the sum can be approximated by replacing all the energy terms in the denominators by their averages $\epsilon_n$. This results in $$\Delta_{min} \approx \frac{N!}{\chi_{N-1}} \prod_{i=1}^{N} \kappa_i. \tag{31}$$

Here the transverse field $\kappa_i$ is allowed to vary from site to site; in many schemes it is uniform. For generic problems, $\Delta_{min} \propto e^{-cN}$, since the denominator scales as $$\chi_{N-1} \sim \delta^{N-1}\left(\frac{N}{2}!\right)^2,$$

for a constant energy scale $\delta$. Eqn. 31 is qualitatively accurate for massively-connected problems.

This form for $\Delta_{min}$ in Eqn. 31 should be shared by more complex transitions, such as non-perturbative crossings or perturbative crossings dominated by particular low-energy paths (e.g., m a transition between ferromagnetic ground states of an Ising chain induced by varying a longitudinal field), at least in the limit where all $\kappa_i$ are small. The reason for this is that if all N spins must flip and the $\kappa_i$ are the only transverse terms in the Hamiltonian, the gap between the states vanishes by symmetry if any of the $\kappa_i$ are taken to zero. Thus, the full expression for the gap must be of the form $$\Delta_{min} = \left(\prod_{i=1}^{N} \kappa_i\right) \times f(\kappa_1, \ldots, \kappa_N) \tag{32}$$

where f is a function of all the K terms (and the parameters in $\hat{H}_{SG}$) that does not necessarily vanish as $\kappa_i \to 0$. Higher-order corrections from this function will modify the effective driving amplitude, as explained below.

Oscillating Fields and Speedups

Consider the N-spin transition between spin glass minima $|G\rangle$ and $|E\rangle$, parametrized by an annealing parameter s which controls a bias field along z (and not the magnitude of a transverse field) as argued above. Deep in the spin-glass phase, near the transition so that the energy difference between $|G\rangle$ and $|E\rangle$ is small compared to the single-spin excitation gap, the dynamics near the transition may be approximated as that of a two-level system, with $$H(s, t) = U(s)(|G\rangle\langle G| - |E\rangle\langle E|) + \frac{\Delta}{2}(|G\rangle\langle E| + H.c.), \tag{33}$$

where $\Delta$ is given by Eqn. 31. Oscillating terms may be introduced by modifying $\Delta \to \Delta(t)$ so as to locally vary the transverse fields:

$$\Delta(t) \approx N! \frac{\prod_{i=1}^{N} \kappa_i(1 + \bar{\alpha}_i \sin(2\pi f_i t))}{\chi_{N-1}}, \tag{34}$$

$$\approx \Delta_{min} \prod_{i=1}^{N} (1 + \bar{\alpha}_i \sin(2\pi f_i t)).$$

In real systems, the scaling of the minimum gap with variation of α single transverse field $\kappa_i \to (1+\nu)\kappa_i$ does not exactly yield $\Delta \to (1+\nu)\Delta$ due to higher-order corrections beyond Nth order perturbation theory. While reducing $\kappa_i$ ($\nu$ negative) typically produces a nearly linear change in $\Delta$, as $\kappa_i$ is increased the corresponding increase in $\Delta$ typically lags $(1+\nu)$, in turn changing both the magnitude of the oscillating term and the mean value as $\nu$ sinusoidally oscillates. The result is $$\Delta(t) \approx \Delta_{min} \prod_{i=1}^{N} (M_0 + a_i \sin(2\pi f_i t)). \tag{35}$$

Here, $M_0 < 1$ (by a small amount that tends to increase with increasing $\kappa$), and $\alpha_i$ similarly lags the bare amplitude $\bar{\alpha}_i$.

To predict the total solution rate $\Gamma_T$ from an oscillatory gap of the form of Eqn. 35, Eqn. 35 is expanded as a power series in $\alpha$ and the contributions at all frequency combinations are summed. Taking into account the factors of ½ that arise from breaking the sines and cosines into exponentials, the solution rate $\Gamma_T$ is $$\Gamma_T \approx \frac{\Delta_{min}^2}{W} \times M_0^N \sum_{n=0}^{N} \left(\frac{\alpha^2}{2}\right)^n \binom{N}{n} \tag{36}$$

$$\approx \frac{\Delta_{min}^2 M_0^N \left(1 + \frac{\alpha^2}{2}\right)^N}{W}.$$

As in the Grover case, the sum in Eqn. 36 grows exponentially with N. Were this exponential to meet or even exceed the decay of $\Delta_{min}^2$ with N, the computational complexity of the problem would change. Undoubtedly, even if it is possible for embodiments herein to change exponential to polynomial difficulty scaling for a particular class of problems, it should not be possible for all problems. Somewhat remarkably, the speedup in Eqn. 36 occurs in spite of the fact that the mean value of the minimum gap is smaller than the $\alpha=0$ case, due to the asymmetry that produces $M_0<1$.

In generic problems, varying the transverse field creates local potential disorder along z as well, through the mechanism of Eqn. 29. These effects can be modeled through fluctuating z fields at each site, and for the protocol sketched in this subsection, where the tones are chosen with randomized frequencies and phases, these effects may not significantly limit performance since they will create an energetic uncertainty $W_r \propto \sqrt{N}$. As argued earlier, this will at most reduce the solution rate by a factor of $\sqrt{N}$, which is modest compared to the exponential increase that comes from summing combinations of tones.

Eqn. 35 was numerically verified through a simple example, namely transitions between ferromagnetic ground states of an all-to-all connected model with a longitudinal bias field:

$$H \approx -\frac{1}{N}\left(\sum_{i=1}^{N} \sigma_i^z\right)^2 + \frac{1-2s}{2N}\sum_{i=1}^{N} \sigma_i^z - \kappa \sum_{i=1}^{N} \sigma_i^x. \tag{37}$$

Here, s evolves from 0 to 1 at a constant rate between initial time $t_0=0$ and final time $t_f$ such that $s(t)=t/t_f$. The transverse field term is modified by $$\kappa \sum_{i=1}^{N} \sigma_i^x \to \kappa \sum_{i=1}^{N} (1+\alpha_i \sin(2\pi f_i t))\sigma_i^x \tag{38}$$

so as to implement driver Hamiltonian $\hat{H}_M(t)$ of Eqn. 2. In Eqn. 38, the frequencies $f_i$ are randomly drawn from a uniform range and amplitudes $\alpha_1$ are randomly chosen as $\pm\alpha$.

Quantum annealing with driver Hamiltonian $\hat{H}_M(t)$ of Eqn. 2 was simulated with N running from 4 to 10 and $\kappa$ increasing from 0.192 to 0.646 so that the minimum gap $\Delta\approx0.01177$ remained constant with increasing N. The full system Hamiltonian was numerically simulated with $\alpha=0.9$ and randomly chosen frequencies, for 30 values of $t_f$ running from 30 to 600, averaged over 400 random tone sets per data point. A small gap point was chosen so that the full advantage of embodiments herein would be most easily visible; as mentioned earlier, if the gap is so large that the sinusoids can only oscillate a few times during the evolution ($t_f \sim 1/f_i$) then the driven transitions will not be adequately sampled to contribute to a speedup. Effective parameters $\{M_0, \alpha\}$ varied from $\{0.992, 0.885\}$ to $\{0.956, 0.81\}$ as N was increased from 4 to 10, illustrating the general observation that both fall as $\kappa$ increases. Also simulated was evolution with a $\bar\alpha$ fixed=0.5 ($M_0 \approx 0.97$, $\alpha \approx 0.845$); in this case the speedup of embodiments herein increased exponentially with N, corresponding to a decrease in the difficulty exponent of the problem.

Figure 20:
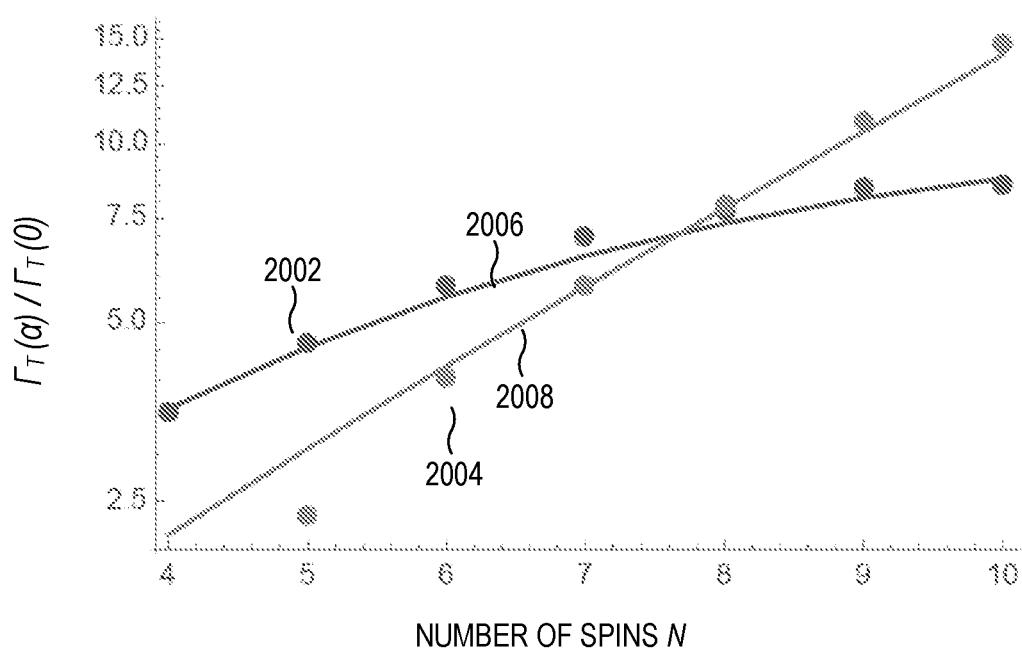
FIG. 20 shows results of a numerical simulation demonstrating that embodiments herein achieve a speedup over constant-schedule annealing for an N-spin transition in an all-to-all connected ferromagnet, in embodiments.

FIG. 20 shows results of the numerical simulation, demonstrating that embodiments herein achieve a speedup over constant-schedule annealing for an N-spin transition in the all-to-all connected ferromagnet of Eqn. 37. Plotted in FIG. 20 is $\Gamma_T(\alpha)/\Gamma_T(0)$, where $\Gamma_T(\alpha)$ is the solution rate with transverse field amplitude oscillations at bare amplitude $\bar\alpha=0.9$, and $\Gamma_T(0)$ is the solution rate for constant-schedule annealing with no variation of the transverse field. A first data set 2002 corresponds to increasing $\kappa$ such that that gap is constant, and a second data set 2004 corresponds to fixed $\kappa=0.5$. A first curve 2006 and a second curve 2008 plot the analytical prediction of Eqn. 35, showing good quantitative agreement with first and second data sets 2002 and 2004, respectively. For fixed transverse field (i.e., second data set 2004 and second curve 2008), the speedup obtained with embodiments grows exponentially in N, demonstrating a reduction of the difficulty exponent of the problem.

Phase-Locking Tones

One way to further improve performance of embodiments utilizing driver Hamiltonian $\hat{H}_M(t)$ of Eqn. 2 is to synchronize the frequencies and phases of the oscillating fields, so that oscillations in the transverse fields of different spins interfere constructively, boosting the strength of the driving term. For example, driving P spins at the same frequency f produces $$\Delta(t)\approx\Delta_{min}(M_0+\alpha \sin(2\pi f t))^P \tag{39}$$

By summing the squared effective amplitudes of the driven terms in Eqn. 39 at the relevant frequency contributions, the total contribution to $\Gamma_T$ scales as $((M_0+\alpha)^P-M_0)^2/\sqrt{P}$ (found by numerically Fourier transforming Eqn. 39), which is potentially a much more substantial boost to performance Driving k groups of P spins produces additional resonances from frequency combination, and leads to an expression similar in form to Eqn. 36.

However, one must be cautious in synchronizing too many tones, as the time-dependent potential disorder created by the oscillations also grows with P and $\alpha$. While in the case of many randomly drawn frequencies this can simply be modeled as a line broadening of the energy difference between the two states (and thus increases the time to solution by a factor of N at most, without altering the difficulty exponent), in the case of large oscillations at frequencies commensurate with the driving this is no longer the case, and the advantage of embodiments herein can fall dramatically. For example, for the standard annealing procedure of simultaneously ramping the transverse field to zero while ramping the spin-glass Hamiltonian from zero to its maximum value, oscillating all the transverse field amplitudes in phase is equivalent to combining a sinusoidally varying offset in the annealing parameter s itself with a global modulation of the Hamiltonian energy scale that is irrelevant to the dynamics. Such oscillations do not sample the transition more efficiently than a simple linear ramp and do not accelerate finding solutions. Optimal performance would likely be reached by choosing k distinct frequencies for the drive fields distributed across the spins, with $1<k<N$ and k likely problem-dependent.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A quantum annealing method, comprising simultaneously:
   decoupling qubits from oscillating fields that drive the qubits according to a driver Hamiltonian; and
   coupling the qubits to each other according to a problem Hamiltonian;

wherein the oscillating fields drive a plurality of transitions such that decoupling and coupling transfer the qubits from an initial state of the driver Hamiltonian to a final state of the problem Hamiltonian.

2. The quantum annealing method of claim 1, further including driving the qubits with the oscillating fields according to the driver Hamiltonian so that each of the oscillating fields drives one of the qubits.

3. The quantum annealing method of claim 2, further comprising:
setting an identical amplitude to the oscillating fields; and
assigning to each of the oscillating fields:
a randomly-chosen frequency; and
a randomly-chosen sign that multiplies the identical amplitude of said each of the oscillating fields.

4. The quantum annealing method of claim 3, wherein assigning the randomly-chosen frequency includes assigning a distinct randomly-chosen frequency to each of the oscillating fields.

5. The quantum annealing method of claim 4, further comprising randomly selecting the distinct randomly-chosen frequency from a frequency range chosen according to a problem class of the problem Hamiltonian.

6. The quantum annealing method of claim 2, further comprising:
assigning each of the oscillating fields to one of a plurality of groups; and
setting an identical frequency and an identical phase to the oscillating fields of each of the groups.

7. The quantum annealing method of claim 2, wherein driving the qubits includes driving the qubits transversely to a quantization axis.

8. The quantum annealing method of claim 7, wherein driving the qubits transversely to the quantization axis includes driving the qubits with the oscillating fields rotating in a plane transverse to the quantization axis.

9. The quantum annealing method of claim 8, further comprising modulating each of the oscillating fields so as to couple a plurality of harmonics to each of the qubits.

10. The quantum annealing method of claim 7, wherein:
each of the qubits is a flux qubit having a loop of superconducting wire interrupted by a superconducting quantum interference device (SQUID); and
driving the qubits transversely to the quantization axis includes threading an oscillating magnetic flux of each of the oscillating fields through the SQUID of a corresponding flux qubit.

11. The quantum annealing method of claim 7, wherein:
each of the qubits is a flux qubit having a loop of superconducting wire interrupted by a superconducting quantum interference device (SQUID); and
driving the qubits transversely to the quantization axis includes coupling an oscillating voltage across the SQUID of a corresponding flux qubit.

12. The quantum annealing method of claim 1, wherein:
decoupling the qubits includes decoupling the qubits according to an annealing schedule; and
coupling the qubits includes coupling the qubits to each other according to the annealing schedule.

13. The quantum annealing method of claim 12, further comprising preparing the qubits, prior to decoupling and coupling, in the initial state of the driver Hamiltonian.

14. The quantum annealing method of claim 13, the initial state of the driver Hamiltonian being a ground state of the driver Hamiltonian.

15. The quantum annealing method of claim 13, the final state of the problem Hamiltonian being a ground state of the problem Hamiltonian.

16. The quantum annealing method of claim 13, wherein preparing the qubits includes ramping up amplitudes of the oscillating fields at a beginning of the annealing schedule.

17. The quantum annealing method of claim 13, wherein preparing the qubits includes ramping up amplitudes of the oscillating fields prior to a beginning of the annealing schedule.

18. The quantum annealing method of claim 1,
wherein coupling the qubits includes adjusting a plurality of interqubit couplings that couple the qubits to each other according to the problem Hamiltonian; and
further including modulating a plurality of transverse interqubit couplings, of the interqubit couplings, that transversely couple the qubits to each other;
wherein modulating the transverse interqubit couplings drives additional transitions such that decoupling and adjusting transfer the qubits from the initial state of the driver Hamiltonian to the final state of the problem Hamiltonian.

19. The quantum annealing method of claim 18, wherein modulating the transverse interqubit couplings includes modulating each of the transverse interqubit couplings.

20. The quantum annealing method of claim 18,
wherein:
decoupling the qubits includes decoupling the qubits according to an annealing schedule; and
adjusting the interqubit couplings includes adjusting the interqubit couplings according to the annealing schedule; and
further comprising changing the modulating of the transverse interqubit couplings according to a second annealing schedule different from the annealing schedule.

21. The quantum annealing method of claim 20, wherein changing the modulating includes:
starting the modulating after a beginning of the annealing schedule; and
stopping the modulating before an end of the annealing schedule.

22. A quantum annealing method, comprising:
decoupling qubits from oscillating fields that drive the qubits according to a driver Hamiltonian;
adjusting a plurality of longitudinal interqubit couplings that longitudinally couple the qubits to each other according to a problem Hamiltonian; and
modulating a plurality of transverse interqubit couplings that transversely couple the qubits to each other;
wherein the oscillating fields and the transverse interqubit couplings, when modulated, drive a plurality of transitions such that decoupling and adjusting transfer the qubits from an initial state of the driver Hamiltonian to a final state of the problem Hamiltonian.

23. The quantum annealing method of claim 22, wherein:
decoupling the qubits includes decoupling the qubits according to an annealing schedule; and
adjusting the longitudinal interqubit couplings includes adjusting the longitudinal interqubit couplings according to the annealing schedule.

24. The quantum annealing method of claim 23, further comprising changing the modulating of the transverse interqubit couplings according to a second annealing schedule different from the annealing schedule.

25. The quantum annealing method of claim 24, wherein changing the modulating includes:
   starting the modulating after a beginning of the annealing schedule; and
   stopping the modulating before an end of the annealing schedule.

26. The quantum annealing method of claim 25, further comprising driving the qubits with the oscillating fields according to the driver Hamiltonian.

27. A quantum annealing method, comprising:
   preparing qubits in an initial state of a problem Hamiltonian;
   coupling the qubits, after preparing, to oscillating fields that drive the qubits according to a driver Hamiltonian; and
   decoupling the qubits, after coupling, from the oscillating fields;
   wherein the oscillating fields drive a plurality of transitions such that coupling and decoupling transfer the qubits from the initial state of the problem Hamiltonian to a final state of the problem Hamiltonian.

* * * * *